(12) United States Patent
Tada et al.

(10) Patent No.: US 9,059,028 B2
(45) Date of Patent: *Jun. 16, 2015

(54) SEMICONDUCTOR DEVICE AND METHOD FOR MANUFACTURING SAME

(75) Inventors: Munehiro Tada, Minato-ku (JP); Toshitsugu Sakamoto, Minato-ku (JP); Hiromitsu Hada, Minato-ku (JP)

(73) Assignee: NEC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/380,728

(22) PCT Filed: Jun. 21, 2010

(86) PCT No.: PCT/JP2010/060425
§ 371 (c)(1),
(2), (4) Date: Dec. 23, 2011

(87) PCT Pub. No.: WO2010/150720
PCT Pub. Date: Dec. 29, 2010

(65) Prior Publication Data
US 2012/0097916 A1    Apr. 26, 2012

(30) Foreign Application Priority Data

Jun. 25, 2009    (JP) ................................. 2009-150777

(51) Int. Cl.
*H01L 47/00* (2006.01)
*H01L 27/10* (2006.01)
(Continued)

(52) U.S. Cl.
CPC .......... *H01L 27/101* (2013.01); *H01L 27/2436* (2013.01); *H01L 27/2454* (2013.01);
(Continued)

(58) Field of Classification Search
CPC .... G11C 13/02; H01L 45/12; H01L 45/1233; H01L 45/1266; H01L 45/146; H01L 45/1625; H01L 45/085; H01L 27/101; H01L 27/2436; H01L 27/2454; H01L 27/2481

USPC ................................ 257/4, E29.029, E47.005
See application file for complete search history.

(56) References Cited

U.S. PATENT DOCUMENTS

2007/0257369 A1 * 11/2007 Huang ........................... 257/758
2007/0285148 A1 * 12/2007 Sakamoto et al. ............ 327/365
(Continued)

FOREIGN PATENT DOCUMENTS

| JP | 2044288843 A | 10/2004 |
|---|---|---|
| JP | 2008244090 A | 10/2008 |

(Continued)

OTHER PUBLICATIONS

Shunichi Kaeriyama, et al., "A Nonvolatile Programmable Solid-Electrolyte Nanometer Switch", IEEE Journal of Solid-State Circuits, Jan. 2005, pp. 168-176, vol. 40, No. 1.

(Continued)

*Primary Examiner* — Vongsavanh Sengdara
(74) *Attorney, Agent, or Firm* — Sughrue Mion, PLLC

(57) ABSTRACT

The objective of the present invention is to provide a semiconductor device provided with a resistance-variable element having sufficient switching property and exhibiting high reliability and high densification as well as good insulating property.

The present invention provides a semiconductor device comprising a resistance-variable element provided within multiple wiring layers on a semiconductor substrate, wherein the resistance-variable element comprises a laminated structure in which a first electrode, a first ion-conductive layer of valve-metal oxide film, a second ion-conductive layer containing oxygen and a second electrode are laminated in this order, and the wiring of the multiple wiring layers also serves as the first electrode.

16 Claims, 19 Drawing Sheets

(51) Int. Cl.
*H01L 27/24* (2006.01)
*H01L 45/00* (2006.01)

(52) U.S. Cl.
CPC .......... *H01L27/2481* (2013.01); *H01L 45/085* (2013.01); *H01L 45/12* (2013.01); *H01L 45/1233* (2013.01); *H01L 45/145* (2013.01); *H01L 45/1616* (2013.01); *H01L 45/1625* (2013.01); *H01L 45/1675* (2013.01)

(56) References Cited

U.S. PATENT DOCUMENTS

| | | | |
|---|---|---|---|
| 2008/0036508 A1* | 2/2008 | Sakamoto et al. | 327/108 |
| 2008/0089112 A1* | 4/2008 | Aratani et al. | 365/148 |
| 2009/0173930 A1* | 7/2009 | Yasuda et al. | 257/4 |
| 2009/0309088 A1 | 12/2009 | Sakamoto | |
| 2010/0096756 A1* | 4/2010 | Tagami et al. | 257/762 |
| 2010/0133501 A1* | 6/2010 | Sakamoto et al. | 257/4 |
| 2010/0167502 A1* | 7/2010 | Yen et al. | 438/478 |

FOREIGN PATENT DOCUMENTS

| | | |
|---|---|---|
| JP | 2008263159 A | 10/2008 |
| JP | 2009-043757 A | 2/2009 |
| WO | WO 2007/114099 A1 | 10/2007 |
| WO | WO 2008/001712 A1 | 1/2008 |
| WO | 2008149605 A1 | 12/2008 |
| WO | WO 2010/079816 A1 | 7/2010 |

OTHER PUBLICATIONS

Communication dated Sep. 2, 2014 from the Japanese Patent Office in counterpart Japanese Patent Application No. 2013145539.
Communication dated May 13, 2014 from the Japanese Patent Office, in counterpart Japanese application No. 2013-145539.

* cited by examiner (A)

(B)

(C)

(A)

(B)

(C)

(A)

(B)

(A)

(B)

(C)

(A)

(B)

(A)

(B)

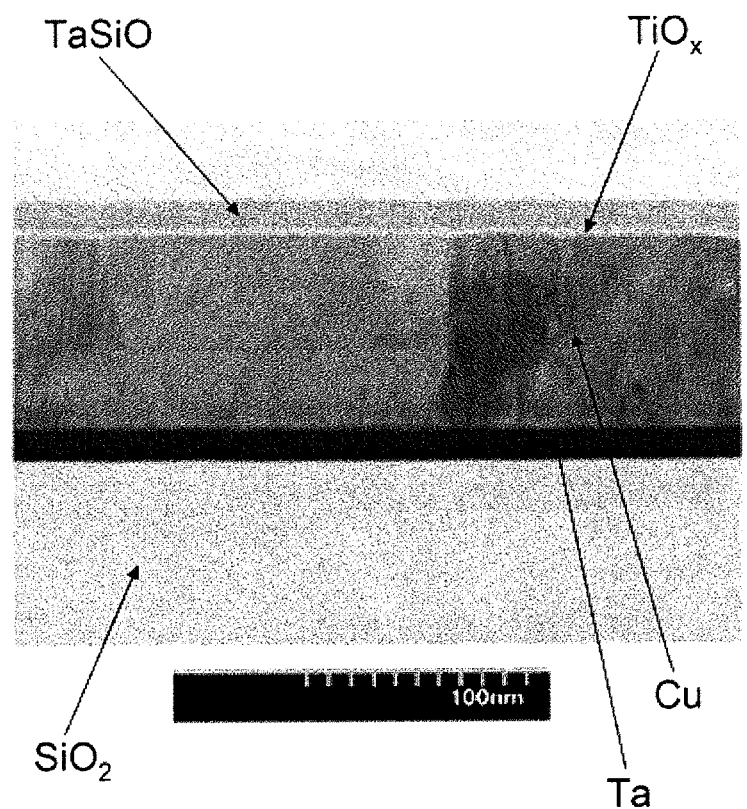

SEMICONDUCTOR DEVICE AND METHOD FOR MANUFACTURING SAME

CROSS REFERENCE TO RELATED APPLICATIONS

This application is a National Stage of International Application No. PCT/JP2010/060425 filed Jun. 21, 2010, claiming priority based on Japanese Patent Application No. 2009-150777, filed Jun. 25, 2009, the contents of all of which are incorporated herein by reference in their entirety.

FIELD OF THE INVENTION

The present invention relates to a semiconductor device and a method for manufacturing the same, and more particularly, the present invention relates to a semiconductor device provided with a field programmable gate array (FPGA) comprising a resistance-variable non-volatile element within multiple wiring layers, and a method for manufacturing the same.

DESCRIPTION OF THE RELATED ART

For semiconductor devices such as silicon devices, studies for integration and low power consumption have been progressed at the pace of 4 folds for three years based Scaling Law (Moore' Law). Recently, the length of gate in MOSFET (Metal Oxide Semiconductor Field Effect Transistor) became 20 nm or less, and costs of devices or mask sets used in lithography processes increased. Further, due to physical limitations in device dimensions (for example, limitations relating to working or unevenness), there is a need for an approach to improve device performances other than the current Scaling Law.

Recently, a re-recordable type programmable logic device which is laid in the middle position between the gate array and the standard cell, so-called FPGA (Field Programmable Gate Array) has been developed. The FPGA allows a user to construct arbitrarily a desired circuit after manufacturing a chip. The FPGA has a resistance-variable element within multiple wiring layers, and a user can electrically connect the wiring as necessary. By using a semi-conductor device provided with such FPGA, the degree of freedom for a circuit may be improved. As the resistance-variable element, ReRAM (Re-sistance Random Access Memory) using a transition metal oxide or NanoBridge (trade mark registered by NEC Corporation) using an ion conductor may be used.

As a resistance-variable element having a high probability of enhancing the degree of freedom of a circuit, a switching-element which uses the migration of metal ions and electrochemical reactions within an ion conductor is disclosed in non-Patent Document 1. The switching-element disclosed in non-Patent Document 1 has a three-layer structure comprising an ion conductive layer, a first electrode and a second electrode, wherein the ion conductive layer is placed between the first and second electrodes, and the first and second electrodes are displaced opposed to each other. The first electrode acts to supply metal ions to the ion conductive layer, but the second electrode dose not supply metal ions.

A behavior of said switching-element is briefly described as below. When the first electrode is grounded and a negative voltage is applied to the second electrode, the first electrode metal is dissolved in the ion conductive layer as metal ions. Then, the metal ions are precipitated as a metal in the ion-conductive layer, and a metal-bridge which connects between the first electrode and the second electrode is formed by the precipitated metal. Due to the electrically connection between the first electrode and the second electrode by the metal-bridge, a switch turns to ON-state. Ontheotherhand, if, in the ON-state, the first electrode is grounded and a positive voltage is applied to the second electrode, a part of the metal-bridge is broken. This led to the beak of the electrically connection between the first electrode and the second electrode, and the switch turns to OFF-state. Since a stage before the electrically connection is completely broken, electrical properties are varied, such as resistance between the first electrode and the second electrodes is increased, or inter-electrode capacity is varied, finally the electrically connection is broken. Furthermore, to switch OFF-state to ON-state, the first electrode should be grounded again and a negative voltage should be applied to the second electrode.

Furthermore, a configuration and the working behavior for the case of a 2-terminal type switching-element is disclosed in non-Patent Document 1, wherein two electrodes are disposed with an ion conductor interposed, and a conduction state therebetween is controlled. Furthermore, a 3-terminal type switching-element is also disclosed in non-Patent 1, wherein one additional control electrode (third electrode) is disposed, and a voltage is applied to the control electrode to control a conduction state in the ion conductor between the first electrode and the second electrode.

These switching-element has character that the size is smaller than the semiconductor type switch such as MOSFET which is usually used in the art, and ON-resistance is low. Therefore, it is considered that the switching-element is useful for applying to programmable logic devices. Furthermore, since the conduction state (ON or OFF) in the switching-element is maintained without change if an applied voltage is turned off, it is considered that they may be used as a non-volatile memory element. For example, a memory cell comprising one selective element such as transistor and one switching-element is used as a base unit, and a plurality of this memory cells are disposed in the longitudinal direction and transversal direction, respectively. By depositing the memory cells in such alignment, any memory cell can be selected among multiple memory cells with word lines and bit lines. Then, the conduction state of the selected memory cell may be detected, and the stored information, i.e. either one of '1' or '0' information may be read from the ON or OFF state of switching-element.

<Prior Art Document>
<Non-Patent Document>

Non-Patent Document 1: Shunichi Kaeriyama et al., "A Nonvolatile Programmable Solid-Electrolyte Nanometer Switch", IEEE Journal of Solid-State Circuits, Vol. 40, No. 1, pp. 168-176, January 2005.

SUMMARY OF THE INVENTION

Problems to be Solved by the Invention

Due to a recent demand for high integration, there are needs for high densification by the miniaturization of a resistance-variable element and the reduction of the number of processes. Also, at the same time, there are needs for improvement of the performance (reduction of a resistance) and the reliability of a resistance-variable element. Therefore, a resistance-variable element which can achieve high integration, high performance and high reliability and a method for manufacturing the same are requested.

The objective of the present invention is to provide a semiconductor device which has a resistance-variable element having sufficient switching property and has advantages for high reliability, high densification and insulating property.

Means for Solving the Problems

A semiconductor device according to the present invention comprises a resistance-variable element provided within multiple wiring layers on a semiconductor substrate, wherein the resistance-variable element comprises a laminated structure in which a first electrode, a first ion-conductive layer composed of an oxide film of valve-metal oxide, a second ion-conductive layer containing oxygen and a second electrode are laminated in this order, and a wiring of the multiple wiring layers also serves as the first electrode.

Preferably, an insulating barrier film is interposed between the first electrode and the first ion-conductive layer, the insulating barrier film has an opening, and the first ion-conductive layer is contacted with the first electrode at the opening.

Preferably, the first electrode comprises copper.

Preferably, the oxide film of valve-metal is a titanium oxide film or an aluminum oxide film.

Preferably, the oxide film of valve-metal is a titanium oxide film, and the thickness of the titanium oxide film is 4 nm or less.

Preferably, the second ion-conductive layer is an oxide primarily containing at least one of Ta, Zr and Hf.

Preferably, the second ion-conductive layer is a composite oxide of Ta and Si.

Preferably, the second ion-conductive layer is a composite oxide of Zr and Si.

Preferably, the second ion-conductive layer may be a composite oxide of Hf and Si.

Preferably, the total film thickness comprising a laminated structure of the titanium oxide and the composite oxide of Ta and Si is 20 nm or less.

Preferably, the multiple wiring layers further has a plug connected electrically to the second electrode, the second electrode comprises a first upper electrode being in contact with the second ion-conductive layer and a second upper electrode being in contact with the plug, and the first upper electrode comprises Ru or Ni.

Preferably, the second upper electrode comprises Ti, Ta, W, or nitrides thereof.

A method for manufacturing the above-mentioned semiconductor device, comprising the steps of:

forming a valve-metal film on the first electrode, and oxidizing the valve-metal film while forming the second ion-conductive layer under the presence of oxygen.

Preferably, the ion-conductive layer is formed by a sputtering or ALD method.

Preferably, the valve-metal film is a titanium film, and the thickness of the titanium film may be 2 nm or less.

Preferably, the second ion-conductive layer is formed using TaSiO as a target under the presence of oxygen by a high frequency sputtering method.

Preferably, the high frequency sputtering method is performed using a mixed gas of oxygen and argon.

Effect of the Invention

According to the present invention, a semiconductor device provided with a resistance-variable element having sufficient switching property and exhibiting good insulating property as well as high reliability and high densification may be provided.

According to the semiconductor device of the present invention, the wiring of the multiple wiring layers also serves as the first electrode, and thus the number of processes needed to manufacture the semiconductor device may be reduced.

Further, according to the semiconductor device of the present invention, since the resistance-variable element has fast electric field diffusion of copper in a titanium oxide layer under low resistance (i.e., "ON" state), a bridge formed by copper ions is divided into pieces within the titanium oxide layer. Thus, the remaining bridge in an ion-conductive layer may be broken by the titanium oxide layer, thereby facilitating voltage application. It may promote the recovery of copper ions at "OFF" state, resulting in improving the switching property of the resistance-variable element.

Further, according to the method for manufacturing a semiconductor device of the present invention, the oxidation of a wiring also serving as the first electrode may be prevented when forming the first ion-conductive layer. More particularly, the oxidation of a wiring may be prevented by the oxidation of a valve-metal film formed on a wiring of material such as copper when forming the second ion-conductive layer.

BRIEF DESCRIPTION OF THE DRAWINGS

FIG. 14C is a result of TEM cross-section observation in Example (Ti; 1 nm).

DETAILED DESCRIPTION OF THE PREFERRED EMBODIMENTS

The present invention relates to a semiconductor device comprising a resistance-variable element provided within multiple wiring layers on a semiconductor substrate, wherein the resistance-variable element comprises a laminated structure in which a first electrode, a first ion-conductive layer composed of an oxide film of valve-metal, a second ion-conductive layer containing oxygen and a second electrode are laminated in this order, and a wiring of the multiple wiring layers also serves as the first electrode.

According to the semiconductor device of the present invention, the wiring of the multiple wiring layers can also serve as the first electrode (for example, lower electrode) of the resistance-variable element, and thus the number of processes needed to manufacture the semiconductor device can be reduced.

According to the semiconductor device of the present invention, the resistance-variable element allows to break a bridge which is formed by copper ions within the second ion-conductive layer by an oxide film of valve-metal, in particular titanium oxide film or aluminum oxide film at the low-resistance-state (i.e., ON-state), thereby promoting the recovery of metal ions such as copper ions at OFF-state. This principle will be specifically described in the case of a copper electrode. First, if an OFF-operation is executed in a state where copper ions form a bridge in an ion-conductive layer (i.e., ON-state), copper ions in a valve-metal oxide (such as titanium oxide film) having fast electric field diffusion are recovered in the copper electrode. Then, a voltage is applied to the valve-metal oxide (insulator). Furthermore, since the valve-metal oxide has fast electric field diffusion of copper, copper ions in a second ion-conductive layer can be rapidly recovered. As a result, the switching property of a resistance-variable element can be enhanced. Said principle is a hypothesis, but the present invention is not limited to this principle.

Furthermore, according to the method for manufacturing a semiconductor device of the present invention, the oxidation of a wiring can be prevented when forming the second ion-conductive layer. More particularly, the oxidation of a wiring can be prevented by the oxidation of a valve-metal film formed on a wiring of material such as copper when forming the second ion-conductive layer. That is, since valve metal such as titanium or aluminum has greater negative value than copper in the standard free energy of oxide thereof, the valve-metal film formed on the wiring acts to absorb oxygen generated during the formation of the second ion-conductive layer, and also the valve-metal changes into the first ion-conductive layer.

(Embodiment 1)

First, the configuration of the resistance-variable element according to the present invention will be described with reference to the drawings.

Figure 1:
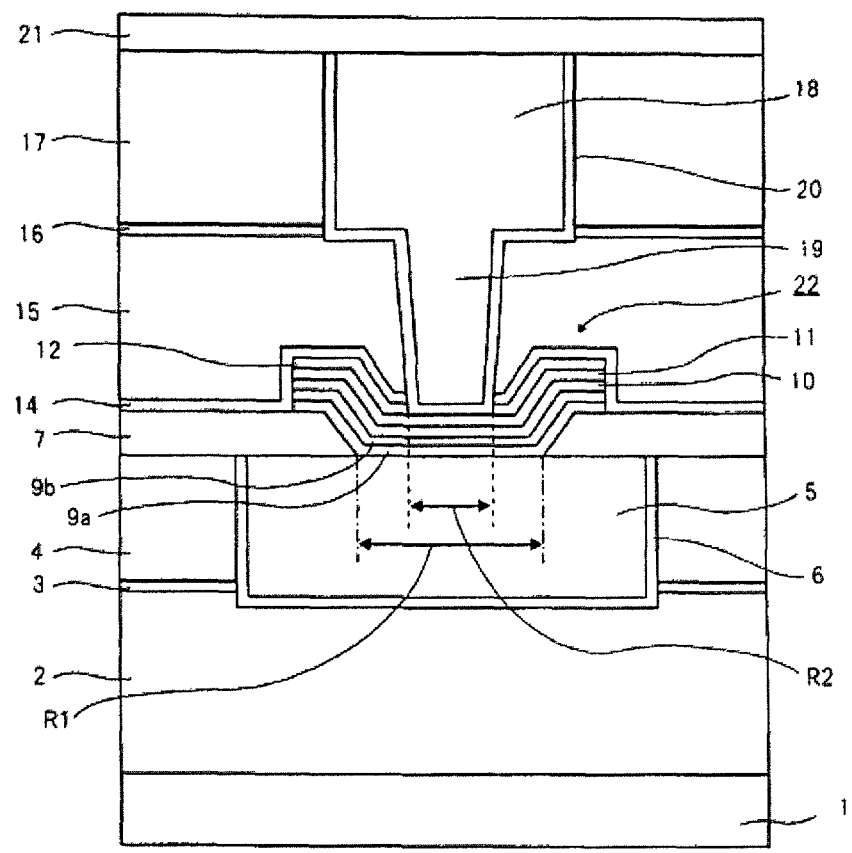
FIG. 1 is a partial schematic cross-section view showing the configuration of the semiconductor device according to Embodiment of the present invention.
Figure 2:
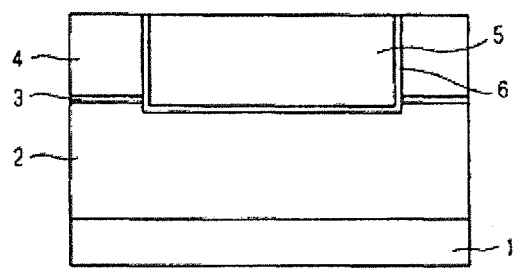
FIG. 2 is a schematic cross-section view showing processes of a method for manufacturing the semiconductor device according to Embodiment 2 of the present invention.
Figure 2:
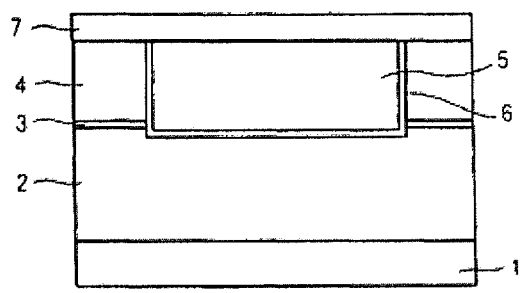
Figure 2:
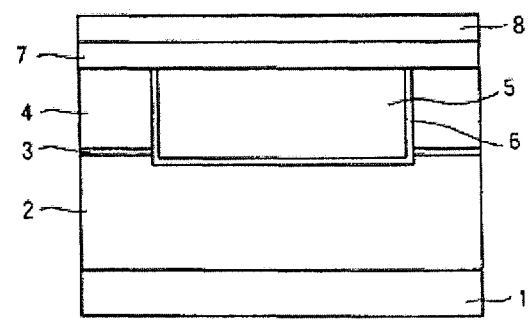
Figure 3:
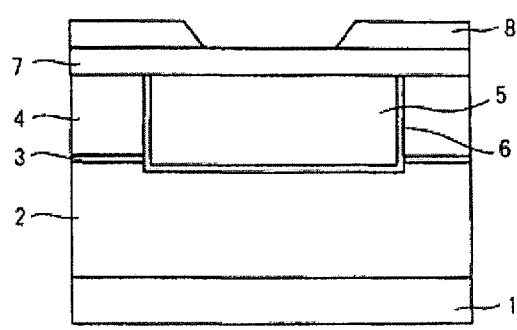
FIG. 3 is another schematic cross-section view showing processes of a method for manufacturing the semiconductor device according to Embodiment 2 of the present invention.
Figure 3:
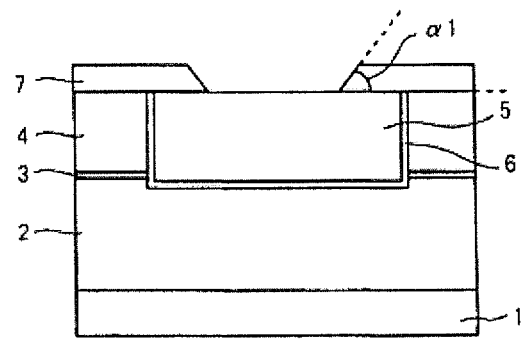
Figure 3:
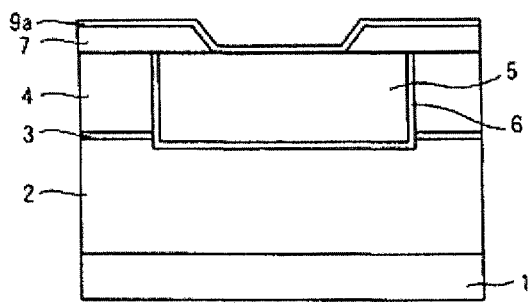
Figure 4:
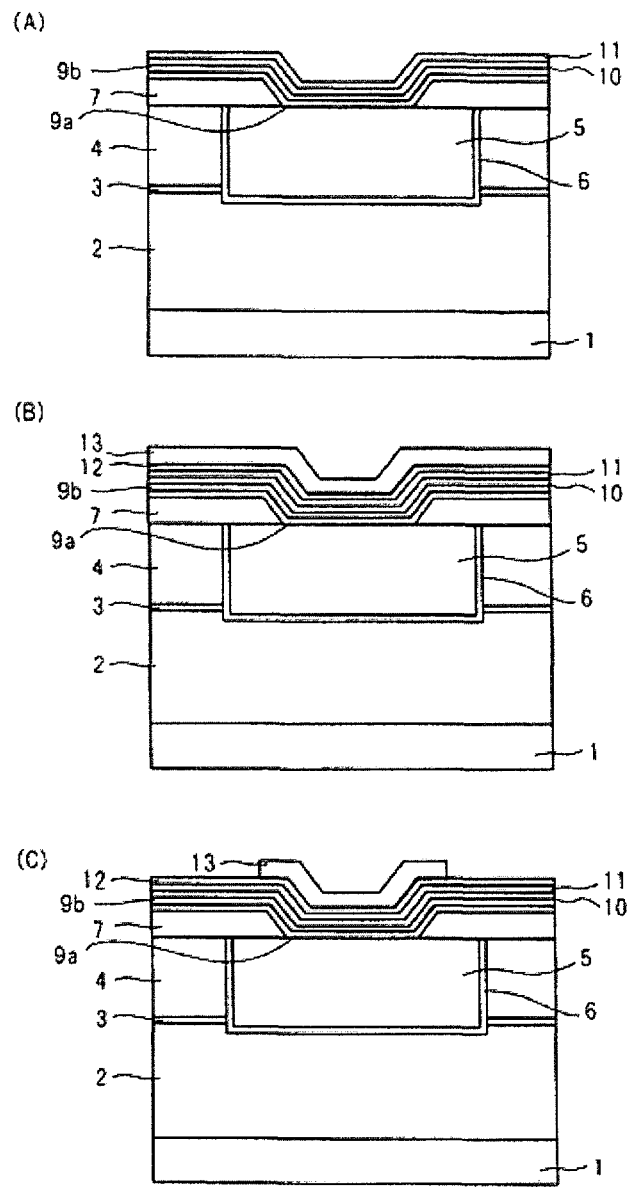
FIG. 4 is still another schematic cross-section view showing processes of a method for manufacturing the semiconductor device according to Embodiment 2 of the present invention.
Figure 5:
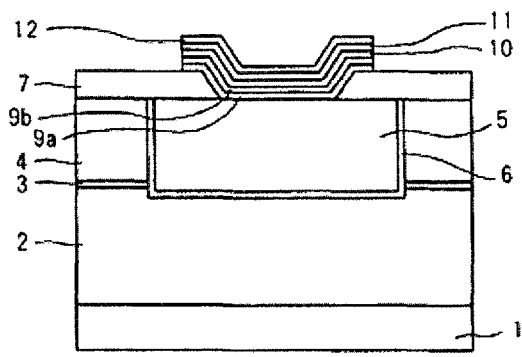
FIG. 5 is further schematic cross-section view showing processes of a method for manufacturing the semiconductor device according to Embodiment 2 of the present invention.
Figure 5:
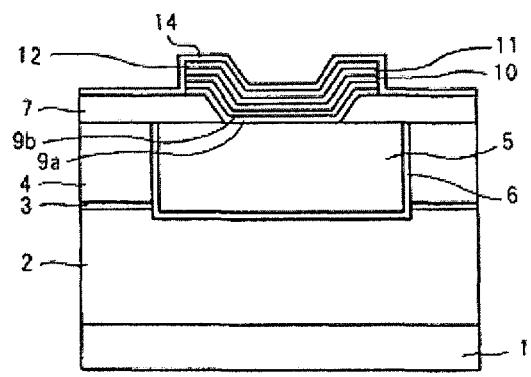

FIG. 1 is a partial schematic cross-section view showing the configuration of the semiconductor device according to Embodiment of the present invention. In FIG. 1, the numerical reference 22 is corresponding to the resistance-variable element. In the present invention, first wiring 5 also serves as the lower electrode of the resistance-variable element, and first ion-conductive layer 9a which is composed of an oxide film of valve-metal is disposed on first wiring 5. The second ion-conductive layer containing oxygen is disposed on first ion-conductive layer 9a. First upper electrode 10 and second upper electrode 11 which function as the second electrode are disposed on the second ion-conductive layer.

<First Electrode>

In the present invention, the first electrode is made of a conductive material, and may comprise, for example, copper, silver and gold. In these materials, the first electrode preferably comprise copper. Impurities such as Al, Sn and Ti may be contained in copper. The first electrode functions to supply metal ions such as copper ions to ion-conductive layers 9a and 9b.

In the present invention, the first electrode is formed by using a wiring of the multiple wiring layers. By employing this configuration, a process for preparing the electrode may be omitted.

<First Ion-conductive Layer>

The first ion-conductive layer is composed of an oxide film of valve-metal. The oxide film of a valve-metal such as titanium or aluminum (titanium oxide film or aluminum oxide film) is formed in contact with the first electrode. The valve-metal is metal which tends to form a passive body (a passive state). As the valve-metal, for example, titanium, aluminum, chromium, or the like are included.

The valve-metal may absorb oxygen generated during formation of the second ion-conductive layer to suppress the oxidation of copper, since the valve-metal has greater negative value than copper in the standard free energy of oxide.

Furthermore, the copper wiring is generally formed by an electric field plating method. However, a few amount of oxygen is contained in a copper film due to impurities present in a plating solution. The oxygen remaining in copper increases the unevenness of a copper bridge generated upon switching. The valve metal functions to absorb oxygen derived from a copper wiring of a bottom layer during a process.

The preferable film thickness of the first ion-conductive layer is 4 nm or less.

By forming the first ion-conductive layer of a valve-metal oxide film such as titanium oxide or aluminum oxide film between the first electrode and the second ion-conductive layer, when switching to high resistance ("OFF" state), a bridge formed by metal ions such as copper ions through the second ion-conductive layer and the valve-metal oxide film (titanium oxide or aluminum oxide) under low resistance (ON-state) is broken by the valve-metal oxide film, in particular titanium oxide or aluminum oxide film, and a metal bridge within the valve-metal oxide film is preferentially recovered. Thus, an electric field is applied within the valve-metal oxide film, and metal ions within the ion-conductive layers can be easily recovered. Therefore, the switching property of the resistance-variable element can be improved.

A method for forming a titanium oxide film (or aluminum oxide film) as the first ion-conductive layer may be formed, for example, by the procedure as described below, but is not particularly limited thereto. First, a titanium film (or aluminum film) is formed on the first electrode. Then, the second ion-conductive layer is formed by a sputtering method. By introducing oxygen during the sputtering process, a titanium film (or aluminum film) is oxidized to a titanium oxide film (or aluminum oxide film).

It is preferred that the thickness of the titanium oxide film is within the range of 1 nm to 3 nm. Since the formation and recovery of a metal bridge in an ion-conductive layer are performed by controling an electric field, a voltage needed for switching operation may be controlled at a low value by making the film thickness of the titanium oxide 3 nm or less.

<Second Ion-conductive Layer>

The second ion-conductive layer contains oxygen. Also, the second ion-conductive layer is preferably an oxide primarily containing at least one of Ta, Zr and Hf.

Also, the second ion-conductive layer is preferably a composite oxide of "Ta, Zr or Hf" and "Si". As an oxide containing Ta, for example, $Ta_2O_5$, $TaSiO_x$ and the like may be used. As an oxide primarily containing Ta, for example, $Ta_{0.8}Si_{0.2}O_x$ may be used. X is preferably within the range of 2~2.5. If x is 2 or more, the generation of defects due to oxygen and the increase of leakage current in an ion-conductive layer may easily be suppressed. Since the leakage current is current leaked in OFF-state, the leakage current is leaked from a switching-element, resulting in increasing operation power.

$Ta_{0.8}Si_{0.2}O_x$ may be formed by a sputtering method, for example a RF sputtering method (high frequency sputtering method). In the RF sputtering method, for example, $Ta_{0.8}Si_{0.2}O_x$ may be formed using a tantalum oxide containing Si content of 20% ($Ta_{0.8}Si_{0.2}O_x$) as a target under the condition of RF power 1~3 KW, room temperature, $Ar/O_2$ mixed gas, and 1.3 [Pa]. Also, a valve-metal film (titanium film) may be oxidized by using a mixed gas containing oxygen. In addition to RF sputtering method, DC sputtering methods using a metal target primarily containing tantalum and a gas containing oxygen may be used. Alternatively, ALD methods may be used besides sputtering methods.

The present invention is a resistance-variable element which utilizes migration of metal ions and electrochemical reactions in the ion conductor (a solid in which ions is free to move by applying an electric field). The first electrode functions to supply metal ions such as copper ions to the first and second ion-conductive layers. The resistance-variable element controls "ON/OFF" by applying a voltage or supplying a current, and also by utilizing the electric field diffusion of copper from the first electrode into the ion-conductive layers.

<Second Electrode>

The second electrode, but is not particularly limited to, preferably comprises Ru, Ni or Pt.

(Embodiment 2)

The semiconductor device according to the present embodiment would be described in detail with reference to the drawings. However, the present invention is not limited to this embodiment.

FIG. 1 is a partial schematic cross-section view showing the configuration of the semiconductor device according to the embodiment of the present invention.

The semiconductor device according to the embodiment of the present invention has the above-mentioned resistance-variable element 22 within multiple wiring layers on semiconductor substrate 1

The multiple wiring layers has an insulating laminated structure in which interlayer insulating film 2, barrier insulating film 3, interlayer insulating film 4, insulating barrier film 7, protective insulating film 14, interlayer insulating film 15, etching stopper film 16, interlayer insulating film 17 and barrier insulating film 21 are laminated in this order on semiconductor substrate 1. In the multiple wiring layers, first wiring 5 is embedded into a wiring groove formed in interlayer insulating film 4 and barrier insulating film 3 with barrier metal 6 interposed.

Also, in the multiple wiring layers, second wiring 18 is embedded into a wiring groove formed in interlayer insulating film 17 and etching stopper film 16. Plug 19 is embedded into a pre-formed hole formed in interlayer insulating film 15, protective insulating film 14 and hard mask film 12. Second wiring 18 is integrally formed with plug 19, and the side or bottom surfaces of second wiring 18 and plug 19 are covered with barrier metal 20.

Resistance-variable element 22 in which first ion-conductive layer 9a, second ion-conductive layer 9b, first upper electrode 10 and second upper electrode 11 are laminated in this order is formed on first wiring 5 which also serves as the lower electrode, the wall surface of opening of insulating barrier film 7 and insulating barrier film 7. Hard mask film 12 is formed on second upper electrode 11. The top or side surface of laminated body of first ion-conductive layer 9a, second ion-conductive layer 9b, first upper electrode 10, second upper electrode 11 and hard mask film 12 is covered with protective insulating film 14. By using first wiring 5 as the lower electrode of resistance-variable element 22, that is, by making first wiring 5 double as the lower electrode, the number of processes may be reduced, and electrode resistance may be decreased. More concretely , only by making a mask set of 2 PR as an additional process in addition to a usual Cu Damascene wiring process, the resistance-variable element may be provided, thereby obtaining a low-resistance element at low cost.

Resistance-variable element 22 is a resistance-variable non-volatile element, and for example, may be made as a switching-element utilizing the migration of metal ions and electrochemical reactions within an ion conductor. Resistance-variable element 22 has first wiring 5 serving as the lower electrode, upper electrodes 10 and 11 connected electrically to plug 19, and ion-conductive layers 9a and 9b interposed between the lower and upper electrodes. In resistance-variable element 22, first ion-conductive layer 9a and first wiring 5 are directly contacted at the region of opening formed in insulating barrier film 7. Also, second ion-conductive layer 9b is directly contacted with the first upper electrode. Second upper electrode 11 is connected electrically to plug 19 with barrier metal 20 interposed. Resistance-variable element 22 may control ON/OFF by applying a voltage or supplying a current, and also by utilizing the electric field diffusion of metal contained in first wiring 5 into the second ion-conductive layer.

Semiconductor substrate 1 has a semiconductor element formed thereon. As semiconductor substrate 1, for example, silicon substrates, single crystal substrates, SOI (Silicon on Insulator) substrates, TFT (Thin Film Transistor) substrates, or substrates for liquid display may be used.

Interlayer insulating film 2 is an insulating film formed on semiconductor substrate 1. As interlayer insulating film 2, for example, silicon oxide films, low dielectric films (for example, SiOCH film) having specific dielectric constant lower than silicon oxide films, or the like may be used. Interlayer insulating film 2 also may be a laminated body of multiple insulating films Barrier insulating film 3 is an insulating film having barrier property, which is interposed between interlayer insulating films 2 and 4. Barrier insulating film 3 functions as an etching stop layer when processing a wiring groove for first wiring 5. As barrier insulating film 3, for example, films such as those of SiN, SiC, SiCN may be used. Barrier insulating film 3 has a wiring groove into which first wiring 5 is embedded, wherein first wiring 5 is embedded into said wiring groove with barrier metal 6 interposed. Barrier insulating film 3 may be omitted depending on the etching condition of wiring groove.

Interlayer insulating film 4 is an insulating film formed on barrier insulating film 3. As inter-layer insulating film 4, for example, silicon oxide films, low dielectric films (for example, SiOCH film) having specific dielectric constant lower than silicon oxide films, or the like may be used. Interlayer insulating film 4 also may be a laminated body of multiple insulating films. Barrier insulating film 4 has a wiring groove into which first wiring 5 is embedded, wherein first wiring 5 is embedded into said wiring groove with barrier metal 6 interposed.

First wiring 5 is a wiring embedded into the wiring groove formed on interlayer insulating film 4 and barrier insulating film 3 with barrier metal 6 interposed. First wiring 5 also serves as the lower electrode of resistance-variable element 22, and is directly contacted with first ion-conductive layer 9a. The bottom surface of second ion-conductive layer 9b is directly contacted with first ion-conductive layer 9a, and the top surface of second ion-conductive layer 9b is directly contacted with the first upper electrode. As first wiring 5, metals capable of diffusing and conducting ions in ion-conductive layers 9a and 9b are used. For example, as first wiring 5, Cu, Ag, Au, or the like may be used, and Cu is preferably used. An alloy with Al may be used as first wiring 5.

Barrier metal 6 is a conductive film having barrier property, and covers over the side or bottom surface of the first wiring to prevent a metal contained in first wiring 5 from being diffused into interlayer insulating film 4 or a lower layer. When first wiring 5 comprises metal elements primarily containing Cu, for example, high melting point metals or nitrides thereof such as tantalum (Ta), tantalum nitride (TaN), titanium nitride (TiN) and tungsten carbo-nitride (WCN), or laminated films thereof may be used as barrier metal 6.

Insulating barrier film 7 is formed on interlayer insulating film 4 containing first wiring 5, and functions to prevent a metal (for example, Cu) contained in first wiring 5 from being oxidized, or being diffused into interlayer insulating film 15, or functions as an etching stop layer when processing ion-conductive layers 9a and 9b. As insulating barrier film 7, for example, films such as those of SiC, SiCN, SiN, or laminated structures thereof may be used. Preferably, insulating barrier film 7 is the same material as protective insulating film 14 and hard mask film 12.

As first and second ion-conductive layers 9a and 9b, materials of which resistance varies due to the action (diffusion, ion conduction, etc.) of metal contained in first wiring 5 (lower electrode) may be used. The first ion-conductive layer is an oxide film of a valve-metal (for example, titanium oxide).

By breaking the bridge formed by metal ions (for example, copper ions) within the ion-conductive layers under low resistance (ON-state) using the first ion-conductive layer (titanium oxide), it is possible to recover metal ions at OFF-state, resulting in improving the switching property of the element.

First ion-conductive layers 9a and second ion-conductive layers 9b are formed on first wiring 5, the tapered surface of opening of insulating barrier film 7, and insulating barrier film 7. Ion-conductive layer 9 is formed such that the portion of outer periphery of region in which first wiring 5 is connected to ion-conductive layer 9 is provided at least along the tapered surface of opening of insulating barrier film 7.

First upper electrode 10 is an electrode at the lower layer of upper electrode in resistance-variable element 22, and is directly contacted with second ion-conductive layer 9b. As first upper electrode 10, metals which have the degree of ionization lower than a metal contained in first wiring 5 and poor diffusion and ion conduction in second ion-conductive layer 9b are used, and preferably metal materials having the absolute value of free energy in oxidation lower than a metal component (for example, Ta) contained in second ion-conductive layer 9b may be used. As first upper electrode 10, for example, Pt, Ru, Ni, or the like may be used, and in these materials Ni may preferably be used. Ni may be cheaply obtained since it is abundant, therefore, if Ni is used, a semiconductor element provided with a resistance-variable element may be manufactured at low cost. In addition, since Ni has slow etching rate in dry etching with a fluorocarbon base, it is possible to process the element without the second upper electrode, and thus manufacturing cost may be more reduced.

Second upper electrode 11 is an electrode at the upper layer of upper electrode in resistance-variable element 22, and is formed on first upper electrode 10. Second upper electrode 11 functions to protect first upper electrode 10. That is, damage on first upper electrode 10 may be inhibited during processes by protecting first upper electrode 10 with second upper electrode 11, thereby it is possible to maintain the switching property of resistance-variable element 22. As second upper electrode 11, for example, Ta, Ti, W or nitrides thereof may be used.

Hard mask film 12 functions as both of a hard mask film and a passivation film when etching second upper electrodes 10, first upper electrodes 11, first ion-conductive layers 9a and second ion-conductive layers 9b. As hard mask film 12, for example, films such as SiN film may be used. It is preferred that hard mask film 12 is the same material as protective insulating film 14 and insulating barrier film 7. That is, the peripheral portion of resistance-variable element 22 is enclosed with the same material to uniform the material interfaces of the element, thereby preventing the permeation of water from external environment as well as protecting from the stripping of materials from resistance-variable element 22.

Protective insulating film 14 is an insulating film which functions to prevent desorption of oxygen from second ion-conductive layer 9b without damage on resistance-variable element 22. As protective insulating film 14, for example, SiN film, SiCN film or the like may be used. It is preferred that protective insulating film 14 is the same material as hard mask film 12 and insulating barrier film 7. If the same material is used, protective insulating film 14 is integrated with insulating barrier film 7 and hard mask film 12 to enhance adhesion at the interface, thereby improving the protection of resistance-variable element 22.

Interlayer insulating film 15 is an insulating film formed on protective insulating film 14. As interlayer insulating film 15, for example, silicon oxide films, SiOC films, low dielectric films (for example, SiOCH film) having specific dielectric constant lower than silicon oxide films, or the like may be used. Interlayer insulating film 15 also may be a laminated body of multiple insulating films. Interlayer insulating film 15 may be the same material as interlayer insulating film 17. Interlayer insulating film 15 has a pre-formed hole for embedding plug 19, wherein plug 19 is embedded into said pre-formed hole with barrier metal 20 interposed.

Etching stopper film 16 is an insulating film, which is interposed between interlayer insulating films 15 and 17. Etching stopper film 16 functions as an etching stop layer when processing a wiring groove for second wiring 18. As etching stopper film 16, for example, SiN film, SiC film, SiCN film or the like may be used. Etching stopper film 16 has a wiring groove into which second wiring 18 is embedded, wherein second wiring 18 is embedded into said wiring groove with barrier metal 20 interposed. Etching stopper film 16 may be omitted depending on the etching condition of wiring groove.

Interlayer insulating film 17 is an insulating film formed on etching stopper film 16. As interlayer insulating film 17, for example, silicon oxide films, SiOC films, low dielectric films (for example, SiOCH film) having specific dielectric constant lower than silicon oxide films, or the like may be used. Interlayer insulating film 17 also may be a laminated body of multiple insulating films. Interlayer insulating film 17 may be the same material as interlayer insulating film 15. Interlayer insulating film 17 has a wiring groove into which second wiring 18 is embedded, wherein second wiring 18 is embedded into said wiring groove with barrier metal 20 interposed.

Second wiring 18 is a wiring embedded into the wiring groove formed on interlayer insulating film 17 and etching stopper film 16 with barrier metal 20 interposed. Second wiring 18 is integrally formed with plug 19. Plug 19 is embedded into the pre-formed hole in interlayer insulating film 15, protective insulating film 14 and hard mask film 12 with barrier metal 20 interposed. Plug 19 is connected electrically to second upper electrode 11 with barrier metal 20 interposed. As second wiring 18 and plug 19, for example, Cu may be used.

Barrier metal 20 is a conductive film having barrier property which covers over the side or bottom surfaces of the second wiring 18 and plug 19 to prevent a metal contained in second wiring 18 (including plug 19) from being diffused into interlayer insulating films 15 and 17 or a lower layer. In the case that second wiring 18 and plug 19 comprise metal elements primarily containing Cu, for example, metals having high melting point or nitrides thereof such as tantalum (Ta), tantalum nitride (TaN), titanium nitride (TiN) and tungsten carbo-nitride (WCN), or laminated films thereof may be used as barrier metal 20. It is preferred that barrier metal 20 is the same material as second upper electrode 11. For example, in the case that barrier metal 20 is constituted of a laminated structure of TaN (lower layer)/Ta (upper layer), it is preferred that TaN of the lower layer material is used for second upper electrode 11. In the case that barrier metal 20 is constituted of Ti (lower layer)/Ru (upper layer), it is preferred that Ti of the lower layer material is used for second upper electrode 11.

Barrier insulating film 21 is formed on interlayer insulating film 17 containing second wiring 10, and functions to prevent oxidation of a metal (for example, Cu) contained in second wiring 10, and to prevent diffusion of a metal contained in second wiring 10 into an upper layer. As barrier insulating film 21, for example, SiN film, SiC film, SiCN film, or laminated structures thereof, or the like may be used.

(Embodiment 3)

Hereinafter, a method for manufacturing the semiconductor device according to the present invention is described with reference to the drawings. However, the present invention is not limited to the following Embodiment.

FIGS. 2-5 are schematic cross-section views showing processes of a method for manufacturing the semiconductor device according to Embodiment 2.

First, interlayer insulating film 2 (for example, silicon oxide film; film thickness 300 nm) is deposited on semiconductor substrate 1 (for example, a substrate on which a semiconductor element is formed). Then, barrier insulating film 3 (for example, SiN film; film thickness 50 nm) is deposited on interlayer insulating film 2. Then, interlayer insulating film 4 (for example, silicon oxide film; film thickness 300 nm) is deposited on barrier insulating film 3. Then, a wiring groove is formed on interlayer insulating film 4 and barrier insulating film 3 using a lithography method (including photoresist formation, dry etching, and removal of photoresist). Then, first wiring 5 (for example, Cu) is embedded into said wiring groove with barrier metal 6 (for example, TaN/Ta; film thickness 5 nm/5 nm) interposed (Step A1; see FIG. 2(A)).

In Step A1, interlayer insulating films 2 and 4 may be formed by a plasma CVD method. The plasma CVD (Chemical Vapor Deposition) method comprises, for example, supplying continuously fuel into a reactor under reduced pressure by vaporizing a gaseous or liquid material, exiting molecules using plasma, and forming a continuous film on a substrate by a reaction such as gas phase reaction or substrate surface reaction.

In Step A1, for example, first wiring 5 may be formed as follows. First, barrier metal 6 (for example, laminated films of TaN/Ta) is formed by a PVD method. After forming Cu seed by the PVD method, Cu is embedded into the wiring groove by an electrolytic plating method, and is subjected to heat treatment at 200° C. or higher. Then, excess Cu other than Cu embedded into the wiring groove is removed by a CMP method to form the first wiring. For a successive process in said forming methods of Cu wiring, usual methods known in the art may be used. In the CMP (Chemical Mechanical Polishing), unevenness of the surface of wafer generated during the process forming a multilayer wiring is flattened by contacting the surface with a rotating polishing pad while supplying a polishing liquid to the surface of wafer. Excess Cu embedded into the groove is polished to form an embedded wiring (Damascene wiring). Alternatively, such a flattening process may be performed by polishing the interlayer insulating film.

Then, insulating barrier film 7 (for example, SiN film; film thickness 50 nm) is formed on interlayer insulating film 4 containing first wiring 5 (Step A2; see FIG. 2(B)).

Herein, insulating barrier film 7 may be formed by a plasma CVD method. It is preferred that the film thickness of insulating barrier film 7 is within about 10 nm-50 nm.

Then, hard mask film 8 (for example, silicon oxide film) is formed on insulating barrier film 7 (Step A3: see FIG. 2(C)).

Herein, to maintaining high etching selectivity in a dry etching process, hard mask film 8 is preferably made up of a material different from that of insulating barrier film 7. Hare mask film 8 may be an insulating film or a conductive film. As hard mask film 8, for example, silicon oxide film, silicon nitride film, TiN, Ti, Ta, TaN, or the like may be used. In addition, SiN/SiO$_2$ laminated body may be used.

Then, an opening is patterned in hard mask film 8 using a photoresist (not shown), and the pattern of the opening is formed in hard mask film 8 by a dry etching using the photoresist as a mask. Then, the photoresist is removed by a method such as oxygen plasma ashing (Step A4; see FIG. 3(A)).

When performing such a dry etching, the etching is not necessarily stopped at the top surface of insulating barrier film 7, and may be reached by the inside of insulating barrier film 7.

Then, an opening is formed in insulating barrier film 7 by an etchback process (dry etching) of insulating barrier film 7 exposed from the opening of hard mask film 8 using hard mask film 8 (member 8 of FIG. 3(A)) as a mask, and first wiring 5 is exposed from the opening of insulating barrier film 7. Then, copper oxides formed on the exposed surface of first wiring 5 are removed by organic stripping treatment using a stripping liquid such as amine-based stripping liquid, and simultaneously residual product of etching produced during the etchback process are removed (Step A5; see FIG. 3(B)).

In Step A5, it is preferred that hard mask film (member 8 of FIG. 3(A)) is completely removed during the etchback process, however, it may remain if it is made of an insulating material. Also, the opening of insulating barrier film 7 may be a circular shape, and the diameter of the circle may be within 30 nm-500 nm.

Furthermore, in Step A5, by using a reactive dry etching as the etchback for insulating barrier film 7, the wall surface of opening of insulating barrier film 7 may be a taper shape. In such a reactive dry etching, a gas comprising fluorocarbon may be used as an etching gas.

Then, oxides on the surface of first wiring 5 are removed by a RF (Radio Frequency; high frequency) etching using a non-reactive gas. As the non-reactive gas, He or Ar may be used.

In Step A7, since the opening of insulating barrier film 7 has water attached thereon due to the organic stripping treatment in Step A5, it may be preferably degassed by heat treatment under reduced pressure at about 250-350° C. prior to the deposition of first ion-conductive layer 9a. In this case, to avoid the re-oxidation of the surface of the wiring (Cu), such a process should be performed under vacuum or nitrogen atmosphere.

Then, metallic Ti (for example, film thickness 2 nm) is deposited on insulating barrier film 7 containing first wiring 5 (Step A7; see FIG. 3(C)).

The metallic Ti may be formed by a PVD or CVD method. The metallic Ti is automatically oxidized by the exposure to oxygen plasma atmosphere during the formation of a resistance-variable element to form titanium oxide.

In this Step, to discover a condition for forming the desired first ion-conductive layer 9a, the inventors eagerly studied (1) a metal formed on insulating barrier film 7 containing first wiring 5, (2) the film thickness of metal, and (3) a method of forming second ion-conductive layer 9b. As a result, it has been found that a preferred metal material is titanium or aluminum, and a particularly preferred metal is titanium. Also, it has been found that the film thickness of titanium oxide is preferably 4 nm or less. In addition, as a method of forming second ion-conductive layer 9b which allows the oxidation of metallic Ti, it has been founded that a RF sputtering method using a target primarily containing oxidized Ta is preferably used.

Figure 15:
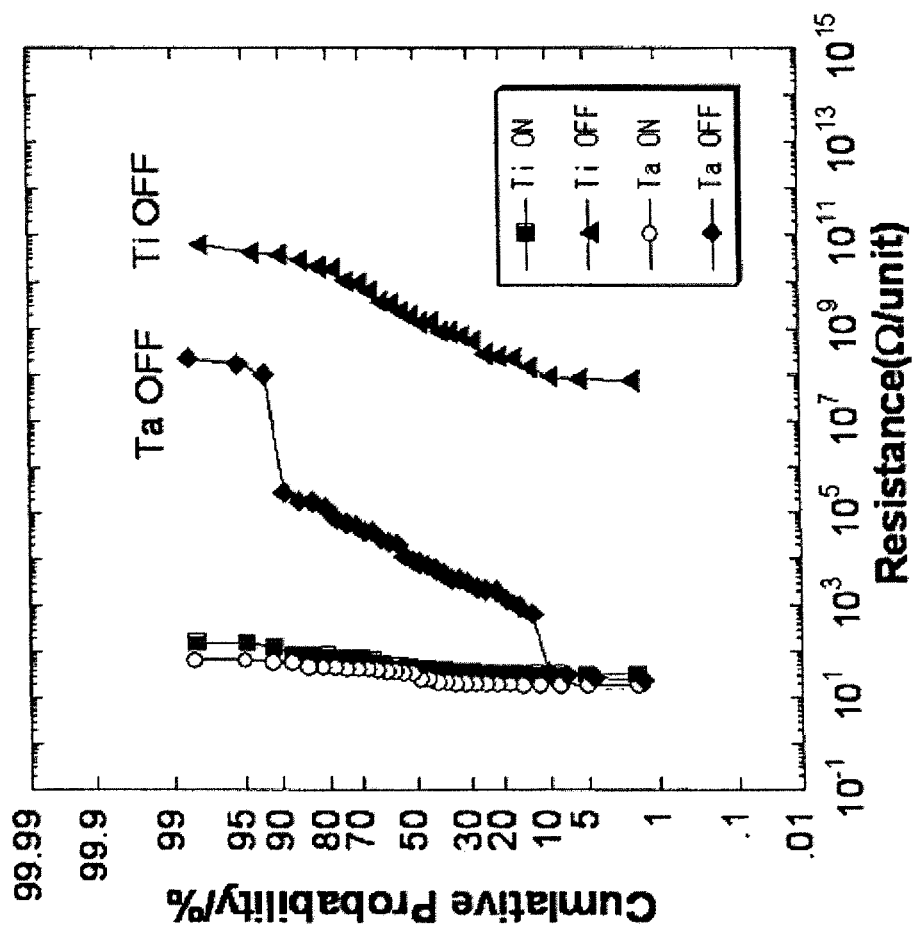
FIG. 15 is the normal distribution of ON/OFF resistance ratio in the semiconductor device according to Embodiment 2 of the present invention.

FIG. 14 shows cross-section views obtained by TEM in the case that Ta or Ti is used as a metal material of the first ion-conductive layer. FIGS. 14A and B show the cases where the film thickness of Ta is 1 nm and 2 nm, respectively. FIGS. 14C to E show the cases where the film thickness of Ti is 1 nm, 2 nm and 3 nm, respectively. FIG. 15 shows the distribution of ON/OFF switching resistance in the case of each metal material (film thickness 2 nm). The second ion-conductive layer was formed by RF sputtering using tantalum oxide ($Ta_{0.8}Si_{0.2}O_x$) containing 20% Si as a target under the condition of RF power 1~3 KW, room temperature, $Ar/O_2$ mixed gas, and 1.3 Pa. More particularly, the condition of $Ar/O_2=80/10$ sccm, the pressure of 1.3 Pa, and RF power 3 kW was used.

Further, as shown in Table 1, by forming a barrier metal film prior to depositing second ion-conductive layer 9b (in this case, $TaSiO_x$) on the first wiring (Cu wiring) using Ti (1 nm or 2 nm) under the above-mentioned condition, the ON/OFF resistance ratio of $10^6$ or more could be obtained. In the case that the film thickness of Ti and Ta is thinned by 1nm, second ion-conductive layer 9b (in this case, $TaSiO_x$) is completely oxidized during a deposition process. Also, while Ti is completely oxidized by 3 nm, a part of Ta remains as metal at the thickness of 2 nm. Switching property (in particular, ON/OFF resistance ratio after cycle) is more excellent when a metal material is completely oxidized. Therefore, the process margin of Ti is greater than that of Ta. Also, if Ta is oxidized, it may happen that a copper wiring at a lower layer is oxidized. To the contrary, in the case of Ti, the oxidation of copper may be inhibited since the permeation of oxygen in a Ti oxide is lower than that of a Ta oxide.

TABLE 1

| Metal film thickness | Film thickness of Second ion-conductive layer | ON/OFF ratio of switching operation | Oxidation of wiring |
|---|---|---|---|
| Ta 1 nm | TaOx 2 nm | >$10^6$ | Yes |
| Ta 2 nm | TaOx 2 nm Ta 1 nm | $10^2$~$10^3$ | No |
| Ta 3 nm | TaOx 2 nm Ta 2 nm | $10^2$~$10^3$ | No |
| Ti 1 nm | TiOx 2 nm | >$10^6$ | No |
| Ti 2 nm | TiOx 3.1 nm | >$10^6$ | No |
| Ti 3 nm | TiOx 4.2 nm | $10^2$~$10^3$ | No |

The oxidation state of Ti may be properly controlled depending to the condition of forming the second ion-conductive layer, for example the amount of oxygen introduced.

Then, first upper electrode 10 (for example, Ru; film thickness 10 nm) and second upper electrode 11 (for example, Ta; film thickness 50 nm) are formed on second ion-conductive layer 9b in this order (Step A8; see FIG. 4(A)).

Then, hard mask film 12 (for example, SiN film; film thickness 30 nm) and hard mask film 13 (for example, $SiO_2$ film; film thickness 150 nm) are laminated on second upper electrode 11 in this order (Step A9; see FIG. 4(B)).

In Step A9, hard mask film 12 and hard mask film 13 may be formed by a plasma CVD method. Hard mask films 12 and 13 may be formed by usual plasma CVD methods known in the art. Also, it is preferred that hard mask films 12 and hard mask film 13 are adifferent type of films. For example, hard mask film 12 may be a SiN film, and hard mask film 13 may be a $SiO_2$ film. In this case, it is preferred that hard mask film 12 is made of the same material as protective insulating film 14 and insulating barrier film 7 as described below. That is, the entire peripheral portion of the resistance-variable element is enclosed with the same material to uniform the material interfaces, thereby preventing the permeation of water from external environment as well as protecting from the stripping of materials from resistance-variable element 22. Also, hard mask film 12 may be formed by a plasma CVD method. For example, a high density SiN film formed by high plasma using a $SiH_4/N_2$ mixed gas may be preferably used.

Then, a photoresist (not shown) for patterning the resistance-variable element is formed on hard mask film 13. Then, a dry etching is subjected to hard mask film 13 using said photo-resist as a mask until hard mask film 12 is exposed. Then, the photoresist is removed by oxygen plasma ashing and organic stripping processes (Step A10; see FIG. 4(C)).

Then, hard mask film 12, second upper electrode 11, first upper electrode 10 and ion-conductive layer 9 (9a and 9b) are sequentially etched by a dry etching using hard mask film (member 13 of 4(C)) as a mask (Step A11; see FIG. 5(A)).

In this Step, it is preferred that hard mask film (member 13 of FIG. 4(C)) is completely removed during the etchback process, but it may remain.

In Step A11, for example, in the case that second upper electrode 11 is Ta, it may be processed by $Cl_2$-based RIE. In the case that first upper electrode 10 is Ru, it may be processed by RIE using a $Cl_2/O_2$ mixed gas. Also, it is requested for etching ion-conductive layers that a dry etching should be stopped at insulating barrier film 7 at the lower layer. In the case that second ion-conductive layer 9b is an oxide containing Ta, and insulating barrier film 7 is SiN film or SiCN film, it may be processed using RIE by controlling an etching condition by a mixed gas such as $CF_4$-based, $CF_4/Cl_2$-based, and $CF_4/Cl_2/Ar$-based mixed gases. By such a hard mask RIE method, the resistance-variable element may be processed without applying oxygen plasma ashing to the resistance-variable element to remove a resist. Further, in case of oxidation treatment by oxygen plasma after processing, the treatment by oxygen plasma may be executed regardless of the stripping time of resist.

Then, protective insulating film 14 (for example, SiN film, 30 nm) is deposited on insulating barrier film 7 comprising hard mask film 12, second upper electrode 11, first upper electrode 10, and ion-conductive layers 9a and 9b (Step A12; see FIG. 5(B)).

In Step A12, protective insulating film 14 may be formed by a plasma CVD method, wherein the inside of a reactor should be maintained at reduced pressure prior to the formation of film. In this case, oxygen is desorbed from the side surface of ion-conductive layer 9, and the problem that leakage current in ion-conductive layers is increased may occur. To effectively suppress this, it is preferred that the temperature of forming of protective insulating film 14 is 250° C. or lower. Also, since the film is exposed to a film forming gas under reduced pressure prior to the formation of film, it is preferred that reductive gase is not used. For example, as protective insulating film 14, a SiN film formed by high density plasma using $SiH_4/N_2$ mixed gas at the substrate temperature of 200° C. may be preferably used.

Then, interlayer insulating film 15 (for example, silicon oxide film), etching stopper film 16 (for example, SiN film), and interlayer insulating film 17 (for example, silicon oxide film) are formed on protective insulating film 14 in this order. Then, awiring groove for second wiring 18 and a pre-formed hole for plug 19 are formed. Then, second wiring 18 (for example, Cu) and plug 19 (for example, Cu) are concurrently formed into the groove and hole with barrier metal 20 (for example, TaN/Ta) interposed by the dual Damascene wiring process. Then, insulating barrier film 21 (for example, SiN film) is deposited on interlayer insulating film 17 containing second wiring 18 (Step A13; see FIG. 1).

In Step A13, to form second wiring 18, the same process as used in the formation of lower layer wiring may be used. In this case, by forming barrier metal 20 and second upper electrode 11 using the same material to reduce a contact resistance between plug 19 and second upper electrode 11, the property of element can be improved (reducing the resistance of resistance-variable element 22 at ON-state).

Also, in Step A13, interlayer insulating film 15 and interlayer insulating film 17 are formed by a plasma CVD method.

In addition, in Step A13, to solve steps formed by resistance-variable element 22, interlayer insulating film 15 may be thickly deposited, and then interlayer insulating film 15 may be planarized by polishing to obtain the desired film thickness of interlayer insulating film 15.

According to the Embodiment of the present invention, by using first wiring 5 as the lower electrode of resistance-variable element 22, that is, by the fact that first wiring 5 also serves as the lower electrode, high densification is achieved by the miniaturization of resistance-variable element 22, as well as the number of processes may be reduced. More particularly, only by making a mask set of 2 PR as an additional process in addition to a usual Cu Damascene wiring process, the resistance-variable element may be provided, thereby achieving to obtain the device at low cost. In addition, resistance-variable element 22 may also be provided within a high technology device comprising a copper wiring, thereby improving the property of device.

Further, according to this Embodiment, ion-conductive layers 9a and 9b may be formed while inhibiting the oxidation of wiring, thereby obtaining the resistance-variable element having high switching property.

Further, when forming titanium oxide film, for example, by depositing metallic Ti on the copper wiring and then forming the second ion-conductive layer by RF sputtering, the metallic Ti is oxidized during the formation of the second ion-conductive layer, thereby being able to form the titanium oxide and the second ion-conductive layer in self-registering manner.

(Embodiment 4)

Hereinafter, the semiconductor device according to the present invention is described with reference to the drawings. However, the present invention is not limited to the following Embodiment.

Figure 6:
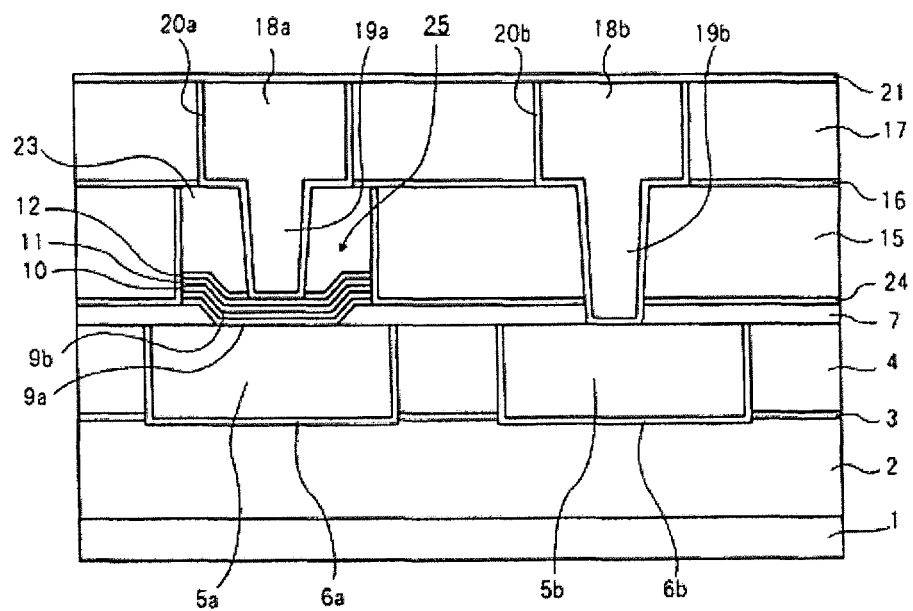
FIG. 6 is a partial schematic cross-section view showing the configuration of the semiconductor device according to Embodiment 4 of the present invention.
Figure 7:
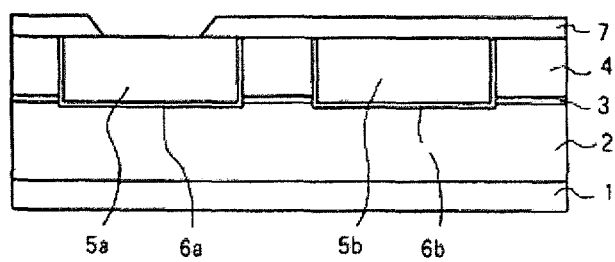
FIG. 7 is a schematic cross-section view showing processes of a method for manufacturing the semiconductor device according to Embodiment 4 of the present invention.
Figure 7:
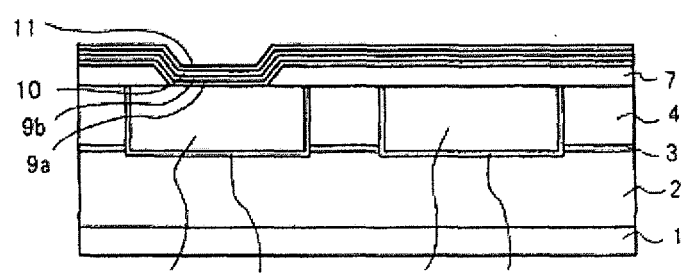
Figure 7:
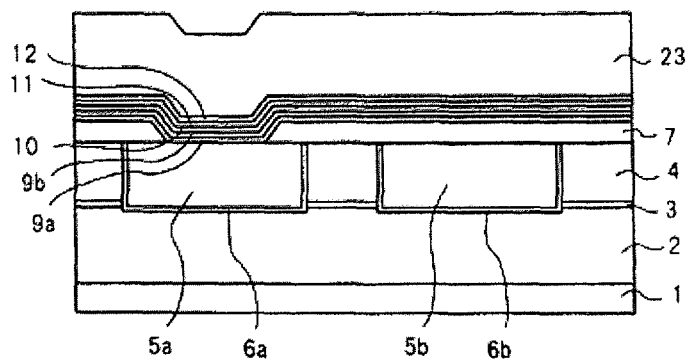
Figure 8:
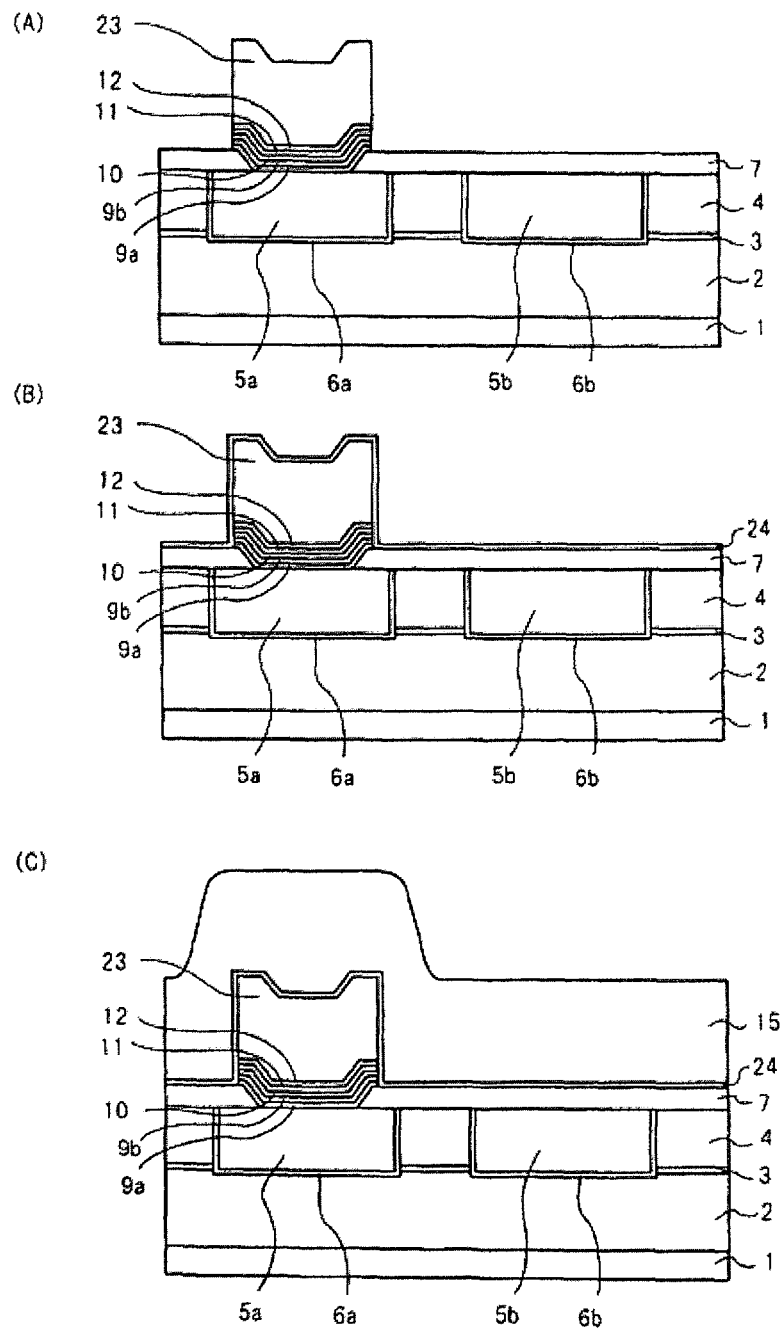
FIG. 8 is another schematic cross-section view showing processes of a method for manufacturing the semiconductor device according to Embodiment 4 of the present invention.
Figure 9:
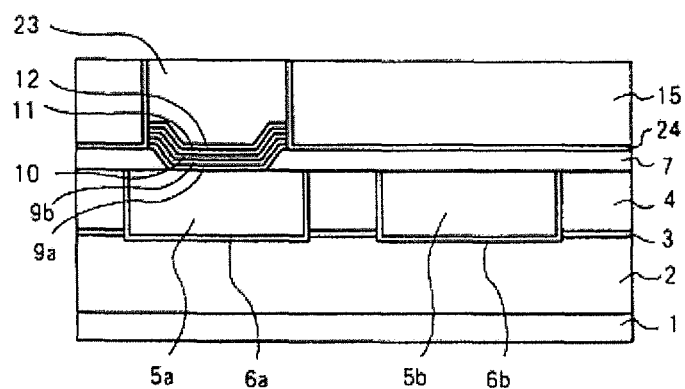
FIG. 9 is still another schematic cross-section view showing processes of a method for manufacturing the semiconductor device according to Embodiment 4 of the present invention.
Figure 9:
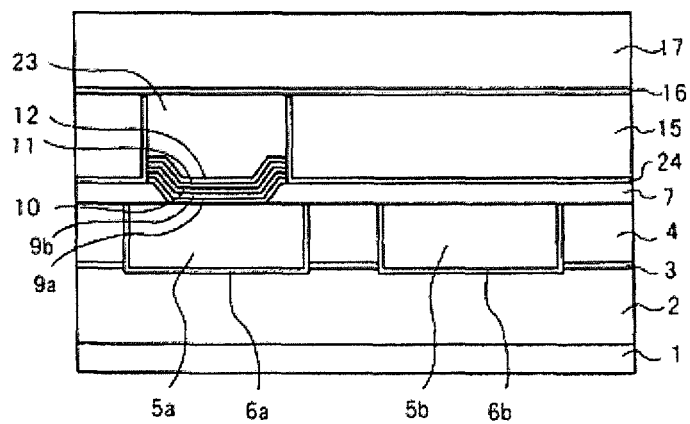
Figure 10:
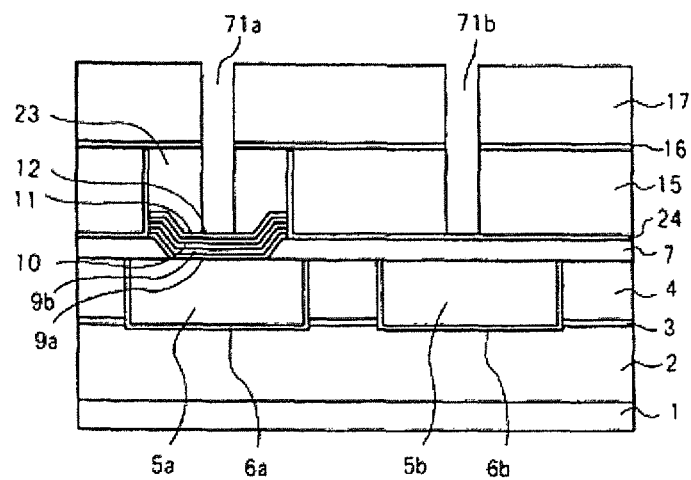
FIG. 10 is further schematic cross-section view showing processes of a method for manufacturing the semiconductor device according to Embodiment 4 of the present invention.
Figure 10:
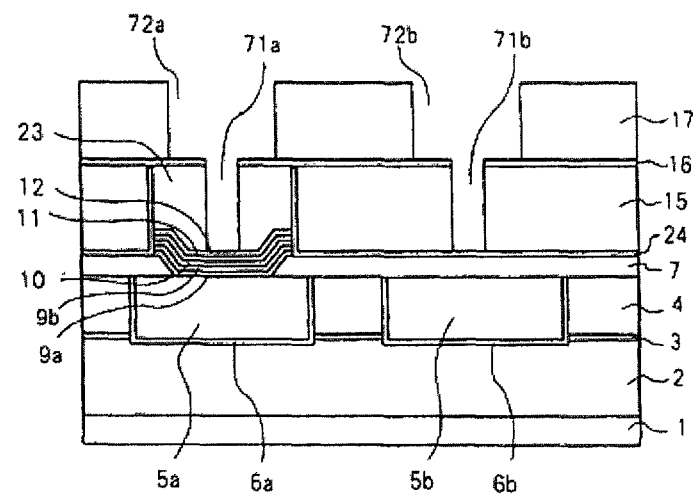

FIG. 6 is a partial schematic cross-section view showing the configuration of the semiconductor device according to this Embodiment.

The semiconductor device as shown in FIG. 1 has the configuration in which the top or side surface of laminated body comprising ion-conductive layers 9a and 9b, first upper electrode 10, second upper electrode 11 and hard mask film 12 is covered with protective insulating film 14. To the contrary, according to this Embodiment, thick hard mask film 23 is formed on the laminated body comprising ion-conductive layers 9a and 9b, first upper electrode 10, second upper electrode 11 and hard mask film 12. Also, the side surfaces of ion-conductive layers 9a and 9b, first upper electrode 10, second upper electrode 11, hard mask film 12 and hard mask film 23 are covered with protective insulating film 24. Protective insulating film 24 is not formed on hard mask film 23, but is formed on insulating barrier film 7. Further, according to this Embodiment, the portions (5b, 18b, 19b) of the wirings are not connected electrically to resistance-variable element 25. Plug 19b of second wiring 18b is connected electrically to first wiring 5b with barrier metal 20b interposed. Other configurations are the same as the semiconductor device shown in FIG. 1

First wiring 5a is a wiring embedded into the wiring groove formed in interlayer insulating film 4 and barrier insulating film 3 with barrier metal 6a interposed. First wiring 5a also serves as the lower electrode of resistance-variable element 25, and is directly contacted with first ion-conductive layer 9a. As first wiring 5a, metals capable of diffusing and conducting ions into ion-conductive layers 9a and 9b, for example Cu may be used. The surface of first wiring 5a may be covered with CuSi.

First wiring 5b is a wiring embedded into the wiring groove formed in interlayer insulating film 4 and barrier insulating film 3 with barrier metal 6b interposed. First wiring 5b is not connected to resistance-variable element 25, but is connected electrically to plug 19b with barrier metal 20b interposed. For first wiring 5b, the same material as first wiring 5a, for example Cu may be used.

Barrier metals 6a and 6b are conductive films having barrier property, and cover over the side or bottom surfaces of the wirings to prevent a metal contained in first wiring 5 from being diffused into interlayer insulating film 4 or a lower layer. In the case that first wirings 5a and 5b comprise metal elements primarily containing Cu, for example, high melting point metals or nitrides thereof such as tantalum (Ta), tantalum nitride (TaN), titanium nitride (TiN) and tungsten carbonitride (WCN), or laminated films thereof may be used as barrier metals 6a and 6b.

Second wiring 18a is a wiring embedded into the wiring groove formed in interlayer insulating film 17 and etching stopper film 16 with barrier metal 20a interposed. Second wiring 18a is integrally formed with plug 19a. Plug 19a is embedded into pre-formed hole formed in hard mask film 23 and hard mask film 24 with barrier metal 20a interposed. Plug 19a is connected electrically to second upper electrode 11 with barrier metal 20a interposed.

Second wiring 18b is a wiring embedded into the wiring groove formed in interlayer insulating film 17 and etching stopper film 16 with barrier metal 20b interposed. Second wiring 18b is integrally formed with plug 19b. Plug 19b is embedded into pre-formed hole formed in interlayer insulating film 15, protective insulating film 24 and insulating barrier film 7 with barrier metal 20b interposed. Plug 19b is connected electrically to first wiring 5b with barrier metal 20b interposed. For second wiring 18b and plug 19b, the same materials as second wiring 18a and plug 19a, for example Cu may be used.

Barrier metals 20a and 20b are conductive films having barrier property, and cover over the side or bottom surfaces of second wirings 18a, 18b and plugs 19a, 19b to prevent metals contained in second wirings 18a and 18b (including plugs 19a and 19b) from being diffused into interlayer insulating films 15 and 17 or a lower layer. In the case that second wirings 18a, 18b and plugs 19a, 19b comprise metal elements primarily containing Cu, for example, high melting point metals or nitrides thereof such as tantalum (Ta), tantalum nitride (TaN), titanium nitride (TiN) and tungsten carbo-nitride (WCN), or laminated films thereof may be used as barrier metals 20a and 20b. It is preferred that barrier metals 20a and 20b are made of the same material as second upper electrode 11. For example, in the case that barrier metals 20a and 20b have a laminated structure of TaN (lower layer)/Ta(upper layer), it is preferred that TaN of the lower layer material is used for second upper electrode 11. Alternatively, in the case that barrier metals 20a and 20b are constituted of Ti (lower layer)/Ru (upper layer), it is preferred that Ti of the lower layer material is used for second upper electrode 11.

Hard mask film 23 functions as a hard mask when etching hard mask film 12. Hard mask film 23 is preferably the type different from hard mask film 12. For example, if hard mask film 12 is a SiN film, and hard mask film 23 may be a SiO$_2$ film.

Protective insulating film 24 is an insulating film which acts to prevent desorption of oxygen from ion-conductive layer 9 without damage on resistance-variable element 25. As protective insulating film 24, for example, SiN film, SiCN film or the like may be used. It is preferred that protective insulating film 24 is made of the same material as hard mask film 12 and insulating barrier film 7. If the same material is used, protective insulating film 24 is integrated with insulating barrier film 7 and hard mask film 12 to enhance interface adhesion.

(Embodiment 5)

Hereinafter, a method for manufacturing the semiconductor device according to Embodiment 4 is described with reference to the drawings. However, the present invention is not limited to the following Embodiment.

FIGS. 7-10 are schematic cross-section views showing processes of a method for manufacturing the semiconductor device according to Embodiment 4.

First, interlayer insulating film 2 (for example, silicon oxide film; film thickness 300 nm) is deposited on semiconductor substrate 1 (for example, a substrate on which a semiconductor element is formed). Then, barrier insulating film 3 (for example, SiN film; film thickness 50 nm) is deposited on interlayer insulating film 2. Then, interlayer insulating film 4 (for example, silicon oxide film; film thickness 300 nm) is deposited on barrier insulating film 3. Then, a wiring groove is formed in interlayer insulating film 4, barrier insulating film 3 and interlayer insulating film 2 by a lithography method (including photoresist formation, dry etching, and photoresist removal). Then, first wirings 5a and 5b (for example, Cu) are embedded into said wiring groove with barrier metals 6a and 6b (for example, TaN/Ta; film thickness 5 nm/5 nm) interposed. Then, insulating barrier film 7 (for example, SiN film; film thickness 50 nm) is formed on interlayer insulating film 4 containing first wirings 5a and 5b. Then, hard mask film (not shown, corresponding to member 8 of FIG. 2(C); for example, silicon oxide film) is formed on insulating barrier film 7. Then, an opening is patterned on hard mask film (corresponding to member 8 of FIG. 2(C)) using a photoresist (not shown). The pattern of opening is formed on hard mask film (corresponding to member 8 of FIG. 3(A)) by a dry etching using the photoresist as a mask. Then, the photoresist is removed by a method such as oxygen plasma ashing. Then, an opening is formed on insulating barrier film 7 by an etchback process (reactive dry etching) of insulating barrier film 7 exposed from the opening of hard mask film (corresponding to member 8 of FIG. 3(A)) using hard mask film (corresponding to member 8 of FIG. 3(A)) as a mask, and first wiring 5 is exposed from on the opening of insulating barrier film 7, wherein the opening is communicated with first wiring 5a. Then, copper oxides formed on the exposed surface of first wiring 5a are removed by organic stripping treatment using a stripping liquid such as amine-based stripping liquid, and simultaneously etching residual products produced during the etchback process are removed (Step B1; see FIG. 7(A)).

In Step B1, the wiring groove with respect to interlayer insulating film 4 and barrier insulating film 3 have the depth overetched by about 70 nm additionally from the bottom surface of interlayer insulating film 4 plus the film thickness of interlayer insulating film 4. Also, barrier insulating film 3 is perforated, and interlayer insulating film 2 is formed with the depth of about 20 nm from the top surface of the barrier insulating film. Thus, by pre-etching barrier insulating film 3, the wiring groove may easily be removed.

Further, in Step B1, a reactive dry etching (etchback) for forming an opening in insulating barrier film 7 may be performed under the condition of $CF_4/Ar=25:50$ sccm, 0.53 Pa, Source 400 W, Substrate bias 90 W. By increasing the source power or increasing the substrate bias, etching ionicity may be enhanced and taper angle may be reduced. Also, about 30 nm of the remaining film of insulating barrier film 7 on the bottom of opening of insulating barrier film 7 may be etched by about 55 nm (about 80% over).

Further, in Step B1, heat treatment at 350° C. under reduced pressure may be performed by using a heat chamber fitted within a sputtering device.

Further, in Step B1, RF etching using a non-reactive gas is performed using Ar gas in a RF etching chamber under the condition of Ar=30 sccm, 1.3 Pa, Source 290 W, Substrate bias 130 W. RF etching time may be quantified based on an etching amount of $SiO_2$ film formed by plasma CVD, and may be set at 3 nm in terms of said $SiO_2$ film.

At the end of Step B1, first wiring 5b is covered with insulating barrier film 7, and first wiring 5b other than opening is RF etched.

Then, a metallic Ti film having the thickness of 2 nm is deposited on insulating barrier film 7 containing first wirings 5a and 5b by DC sputtering.

Then, second ion-conductive layer 9b (for example, $Ta_{0.8}Si_{0.2}O_x$; film thickness 13 nm) is deposited on insulating barrier film 7 containing first wirings 5a and 5b by RF (Radio Frequency; high frequency) sputtering. Herein, the metallic Ti film is completely oxidized by oxygen plasma during the formation of second ion-conductive layer 9 to form titanium oxide film (first ion-conductive layer 9a).

Then, first upper electrode 10 (for example, Ru; film thickness 10 nm) and second upper electrode 11 (for example, Ta; film thickness 50 nm) are formed on second ion-conductive layer 9b in this order (Step B2; see FIG. 7(B)).

In Step B2, RF sputtering of second ion-conductive layer 9b may be performed using tantalum oxide ($Ta_{0.8}Si_{0.2}O_x$) containing 20% Si as a target under the condition of RF power 1~3 KW, room temperature, $Ar/O_2$ mixed gas, and 1.3 Pa.

Specifically, the condition of $Ar/O_2$=80/10 sccm, pressure 1.3 Pa, and RF power 3 kW may be used. Under this condition, when observing the thickness of titanium oxide film relative to the thickness of metallic Ti film by TEM cross-section observation, it has been found that the film thickness was varied as follows: Ti 1 nm→titanium oxide 2 nm, Ti 2 nm→titanium oxide 3.1 nm, Ti 3 nm→titanium oxide 4.2 nm. Also, in the case that the thickness of titanium oxide film is 2 nm or 3.1 nm, the switching property having ON/OFF resistance ratio of 6 figures or more was confirmed. On the other hand, in the case that the thickness of titanium oxide film is 4.2 nm, the switching property having ON/OFF resistance ratio of 2-3 figures was confirmed, and yield was also lowered. Thus, it was understood that if the thickness of titanium oxide film is thick, a bridge formed by a metal such as Cu may not be sufficiently recovered at OFF state, and thus OFF resistance is lowered and ON/OFF ratio is deteriorated. From this result, the thickness of titanium oxide film (first ion-conductive layer 9a) is preferably 4 nm or less.

Further, depending on the specification of device, in the case that oxidizing power by oxygen plasma is strong, $Ar/O_2$ mixed gas may be changed to pure Ar gas. In addition, the oxidation state of a valve-metal such as metallic Ti may be properly controlled by lowering temperature below room temperature. Alternatively, in the case that oxidizing power by oxygen plasma is weak (when there is Ti residual), the oxidizing power may be increased by increasing oxygen amount in $Ar/O_2$ mixed gas.

Further, in order to maintain the high film-forming rate for second ion-conductive layer 9b, the condition used in forming the film may be changed to 2 steps condition. More particularly, the deposition is performed using pure Ar gas in a first step, and then the deposition is performed using $Ar/O_2$ mixed gas in a second step. Since $Ar/O_2$ mixed gas exhibits fast film-forming rate, the throughput may be effectively improved.

Also, since the total film thickness of first ion-conductive layer 9a and second ion-conductive layer 9b affects electric field applied to the element, if the total thickness is too thick, voltage needed for a switching operation may tend to be increasing. The total thickness of a laminated body is preferably 20 nm or less from the viewpoint of the range of practical working voltage (for example, 12 V or less).

Further, in Step B2, first upper electrode 10 may be deposited by DC (direct current) sputtering using Ru as a target under the condition of DC power 0.2 kW, Ar gas, and 0.27 Pa. In addition, second upper electrode 11 may also be deposited by DC sputtering using Ta a target under the same condition. Since both of first upper electrodes 10 and 11 are deposited under reduced pressure, the deposition is performed at room temperature to inhibit oxygen separation from second ion-conductive layer 9b.

At the end of Step B2, first wiring 5b is covered with insulating barrier film 7, ion-conductive layers 9a and 9b, first upper electrode 10 and second upper electrode 11.

Then, hard mask film 12 (for example, SiN film; film thickness 30 nm) and hard mask film 23 (for example, $SiO_2$ film; film thickness 200 nm) are laminated on second upper electrode 11 in this order (Step B3; see FIG. 7(C)).

Herein, hard mask film 12 and hard mask film 23 may be formed by a plasma CVD method. Hard mask films 12 and 23 may be formed by usual plasma CVD methods known in the art. The film-forming temperature was 200° C.

At the end of Step B2, first wiring 5b is covered with insulating barrier film 7, ion-conductive layers 9a and 9b, first upper electrode 10, second upper electrode 11, hard mask film 12, and hard mask film 23.

Then, a photoresist (not shown) for patterning the resistance-variable element is formed on hard mask film 23. Then, a dry etching is subjected to hard mask film 23 using said photo-resist as a mask until hard mask film 12 is exposed. Then, the photoresist is removed by oxygen plasma ashing and organic stripping processes. Then, hard mask film 12, second upper electrode 11, first upper electrode 10, and ion-conductive layer 9 are sequentially dry etched using hard mask film 23 as a mask (Step B4; see FIG. 8(A)).

In Step B4, the dry etching of hard mask film 23 is preferably stopped at the top surface or the inside of hard mask film 12. In this case, second ion-conductive layer 9b is not exposed to oxygen plasma since it is covered with hard mask film 12. Hard mask film 23 may be dry etched using a usual parallel flat-type dry etching device.

In Step B4, each of hard mask film 12, second upper electrode 11, first upper electrode 10, and ion-conductive layers 9a and 9b may be etched using a parallel flat-type dry etcher. Hare mask film 12 (for example, SiN film) may be etched under the condition of $CF_4/Ar$=25/50 sccm, 0.53 Pa, Source 400 W, Substrate bias 90 W.

Also, second upper electrode 11 (for example, Ta) may be etched under the condition of $Cl_2$=50 sccm, 0.53 Pa, Source 400 W, Substrate bias 60 W.

Also, first upper electrode 10 (for example, Ru) may be etched under the condition of $Cl_2/O_2$=5/40 sccm, 0.53 Pa, Source 900 W, Substrate bias 100 W.

Also, first ion-conductive layers 9a and second ion-conductive layers 9b (for example, $Ta_{0.8}Si_{0.2}O_x$) may be etched under the condition $Cl_2/CF_4/Ar$=45/15/15 sccm, 1.3 Pa, Source 800 W, Substrate bias 60 W. By using these conditions, the generation of sub-trench may be inhibited during the procedure. Also, the remaining film of insulating barrier film 7 on first wirings 5a and 5b may be controlled such that the thickness is 40 nm.

Then, protective insulating film 24 (for example, SiN film, 30 nm) is deposited on insulating barrier film 7 containing hard mask film 12, second upper electrode 11, first upper electrode 10 and ion-conductive layer 9 using hard mask film 23 as a mask (Step B5; see FIG. 8(B)).

In Step B5, protective insulating film 24 may be formed by high density plasma using $SiH_4$ and $N_2$ as fuel gases at the substrate temperature of 200° C. Since a reductive gas such as $NH_3$ or $H_2$ is not used, the reduction of second ion-conductive layer 9 (for example, $Ta_{0.8}Si_{0.2}O_x$) may be inhibited during a film-forming gas stabilizing process just before the film is formed. Since insulating barrier film 7, protective insulating film 24 and hard mask film 12 over first wiring 5 are SiN films formed using the same material, the peripheral portion of the resistance-variable element is integrally formed and protected to improve interface adhesion. As a result, water-absorbing property, water-proofing property, oxygen-desorption tolerability can be improved, thereby improving the yield and reliability of the element.

Then, interlayer insulating film 15 (for example, silicon oxide film; film thicknes 500 nm) is deposited on protective insulating film 24 by plasma CVD (Step B6; see FIG. 8(C)).

Then, interlayer insulating film 15 is flattened by CMP (Step B7; see FIG. 9(A)).

In flattening step of interlayer insulating film 15, interlayer insulating film 15 may be shaved by about 350 nm from the top surface of interlayer insulating film such that the thickness of the remaining film is about 150 nm. Interlayer insulating film 15 may be polished using colloidal silica or seria-based slurry which is usually used in CMP. According to this Embodiment, by flattening interlayer insulating film 15, hard mask film 23 is exposed, and hard mask film 23 and protective insulating film 24 are also flattened.

Then, etching stopper film 16 (for example, SiN film; film thickness 50 nm) and interlayer insulating film 17 (for example, silicon oxide film; film thickness 300 nm) are deposited on interlayer insulating film 15 containing hard mask film 23 and protective insulating film 24 in this order (Step B8; see FIG. 9(B)).

In Step B8, etching stopper film 16 and interlayer insulating film 17 may be deposited by plasma CVD.

Then, second wiring (members 18a and 18b of FIG. 6) and plug (members 19a and 19b of FIG. 6) are formed by Via-First method of a dual Damascene method.

In the Via-First method, first, a photoresist (not shown) for pre-forming holes 71a and 71b for plug (members 19a and 19b of FIG. 6) is formed on interlayer insulating film 17. Then, hole 71a for plug (member 19a of FIG. 6) is formed in interlayer insulating film 17, etching stopper film 16 and hard mask film 23 by a dry etching using said photoresist as a mask, and simultaneously hole 71b for plug (member 19b of FIG. 6) is formed in interlayer insulating film 17, etching stopper film 16 and hard mask film 15. Then, the photoresist is removed by oxygen plasma ashing and organic stripping processes (Step B9; see FIG. 10(A)).

In Step B9, an etching condition and time may be controlled such that the dry etching is stopped at hard mask film 12 on the bottom of pre-formed hole 71a and protective insulating film 24 on the bottom of pre-formed hole 71b. In this case, since the dry etching is stopped at hard mask film 12 on the bottom of pre-formed holes 71a and 71b, the top surface or the inside of protective insulating film 24, each of holes 71a and 72b may be patterned using separate reticles, respectively, and then may be formed under a different etching condition.

Then, a photoresist (not shown) for forming wiring grooves 72a and 72b for second wiring (members 18a and 18b of FIG. 6) is formed on interlayer insulating film 17. Then, wiring grooves 72a and 72b for second wiring (members 18a and 18b of FIG. 6) are formed in inter-layer insulating film 17 and etching stopper film 16 by a dry etching using said photoresist as a mask. Then, the photoresist is removed by oxygen plasma ashing and organic stripping processes (Step B10; see FIG. 10(B)).

In Step B10, the bottoms of pre-formed holes 71a and 71b may be prevented from being perforated by embedding a material such as ARC (Anti-Reflection Coating; anti-reflective film) into the bottoms of pre-formed holes 71a and 71b.

Further, in Step B10, since the bottoms of pre-formed holes 71a and 71b is protected with hard mask film 12, oxidation damage by oxygen plasma ashing may be prevented.

Then, by etching hard mask film 12 on the bottom of pre-formed hole 71a and protective insulating film 24 and insulating barrier film 7 on the bottom of pre-formed hole 71b, second upper electrode 11 and first wiring 5b are exposed through pre-formed holes 71a and 71b, respectively. Then, second wirings 18a and 18b (for example, Cu), and plugs 19a and 19b (for example, Cu) are concurrently formed in wiring grooves 72a and 72b, and pre-formed holes 71a and 71b with barrier metals 20a and 20b (for example, Ta; film thickness 5 nm) interposed. Then, insulating barrier film 21 (for example, SiN film) is deposited on interlayer insulating film 17 containing second wirings 18a and 18b (Step B11; see FIG. 6).

In Step B11, second wirings 18a and 18b may be formed by using the same process as in forming the lower wirings. Herein, the diameter (corresponding to R2 of FIG. 1) of the bottom of plug 19a is preferably less than the diameter (corresponding to R1 of FIG. 1) of opening of insulating barrier film 7. According to this Embodiment, the diameter of the bottom of plug 19a was 240 nm, and the diameter of opening of insulating barrier film 7 was 400 nm. Also, the width of first wiring 5a which also serves as the lower electrode of resistance-variable element 25 is preferably greater than the diameter of opening of insulating barrier film 7. Further, barrier metal 20a and second upper electrode 11 may be formed using the same material to reduce contact resistance between plug 19 and second upper electrode 11, thereby improving the performance of the element (reduction in the resistance of resistance-variable element 25 at "ON" state).

The voltage of −5 V was applied to the upper electrode 10 of resistance-variable element 25 as formed above to cause forming, and its resistance was set to 100Ω (low resistance). Likewise, the voltage of 0.5 V was applied to the upper electrode 10 of resistance-variable element 25, and it was confirmed that its resistance was set to 1 GΩ (high resistance).

As a comparative example, the thickness of metal barrier film in which 13 nm $TaSiO_x$ film is used as first ion-conductive layer 13 and 10 nm Ru film is used as the upper electrode, and the film thickness of first ion-conductive layer 9a after oxidation, and its switching working and the result of wiring oxidation are summarized in Table 1. There is a case that the wiring (for example, Cu wiring also serving as the lower electrode) is oxidized depending on a condition under which second ion-conductive layer is formed. In the case that the wiring is oxidized, the sheet resistance of the wiring may be increased, and ULSI working may be adversely affected.

The film thickness of first ion-conductive layer 9a is preferably 4 nm or less from the viewpoint of achieving ON/OFF resistance ratio of $10^6$ or higher as well as inhibiting the oxidation of the wiring. Further, the film thickness of first ion-conductive layer 9a may have thinner thickness than the range presented in the embodiment as long as the oxidation of the lower layer wiring (also serving as the lower electrode) can be inhibited.

According to this Embodiment, in the process of connecting second upper electrode 11 of resistance-variable element 25 to plug 19a, first wiring 5b is also connected to plug 19b in the process, thereby reducing the number of processes, as well as this embodiment can achieve the same effect as in Embodiment 2. Also, according to this Embodiment, since, in addition to resistance-variable element 25, the peripheral portion of plug 19a connected to resistance-variable element 25 is also covered with protective insulating film 24 (for example, SiN film) with hard mask film 23 (for example, silicon oxide film) interposed, the portion of resistance-variable element 25 connected to plug 19a is sufficiently protected, thereby improving the reliability of the element.

(Embodiment 6)

Hereinafter, the semiconductor device according to this Embodiment is described with reference to the drawings. However, the present invention is not limited to the following Embodiment.

Figure 11:
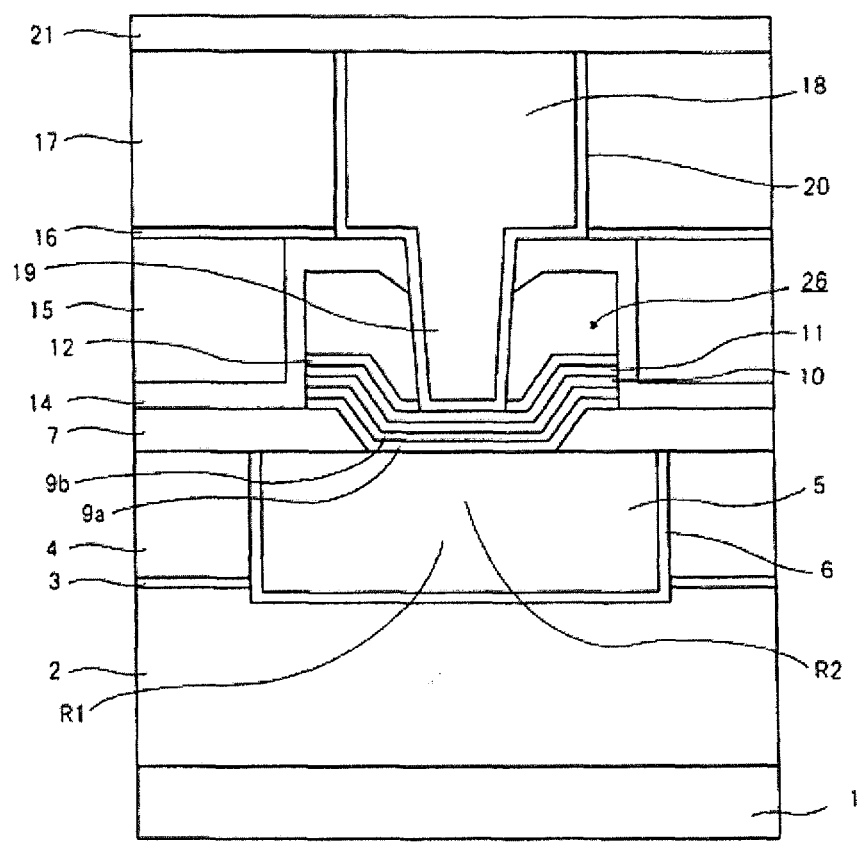
FIG. 11 is a partial schematic cross-section view showing the configuration of the semiconductor device according to Embodiment 6 of the present invention.

FIG. 11 is a partial schematic cross-section view showing the configuration of the semiconductor device according to this Embodiment.

According to this Embodiment, the thickness of hard mask film 28 (for example, silicon oxide film) is thinner than the thickness of hard mask film (member 23 of FIG. 6), protective insulating film 29 (for example, SiN film) is disposed on hard mask film 28, plug 19 which is connected to resistance-variable element 30 is embedded into the pre-formed hole formed in protective insulating film 29, hard mask film 28 and hard mask film 12 with barrier metal 20 interposed. Other configurations are the same as in Embodiment 4.

Hard mask film 28 functions as a hard mask when etching hard mask film 12. Hard mask film 28 is preferably the type different from hard mask film 12. For example, hard mask film 12 is a SiN film, and hard mask film 28 may be a $SiO_2$ film.

Protective insulating film 29 is an insulating film which functions to prevent oxygen desorption from second ion-conductive layer 9b without damage on resistance-variable element 26. As protective insulating film 29, for example, SiN film, SiCN film, or the like may be used. It is preferred that protective insulating film 29 is the same material as hard mask film 12 and insulating barrier film 7. If the same material is used, protective insulating film 29 is integrated with insulating barrier film 7 and hard mask film 12 to enhance interface adhesion. Also, protective insulating film 29 may be preferably the same material as etching stopper film 16.

With respect to a method for manufacturing the semiconductor device according to this Embodiment, the same method as in Embodiment 5 is used, with the exception that hard mask film 28 (member 23 of FIG. 7(C)) has thinner thickness in Step B3 of Embodiment 5 (see FIG. 7(C)), and CMP is performed until protective insulating film 29 (member 24 of FIG. 9(A)) is exposed when flattening interlayer insulating film 15 by CMP in Step B7 (see FIG. 9(A)).

According to this Embodiment, in addition to the same effect as in Embodiment 2, by forming hard mask film 28 thinly and controlling the polishing amount of interlayer insulating film 15 by CMP, etching stopper film 16 of the same material is formed on protective insulating film 29, thereby easily forming the pre-formation hole in plug 19.

(Embodiment 7)

Hereinafter, the semiconductor device according to this Embodiment is described with reference to the drawings. However, the present invention is not limited to the following Embodiment.

Figure 12:
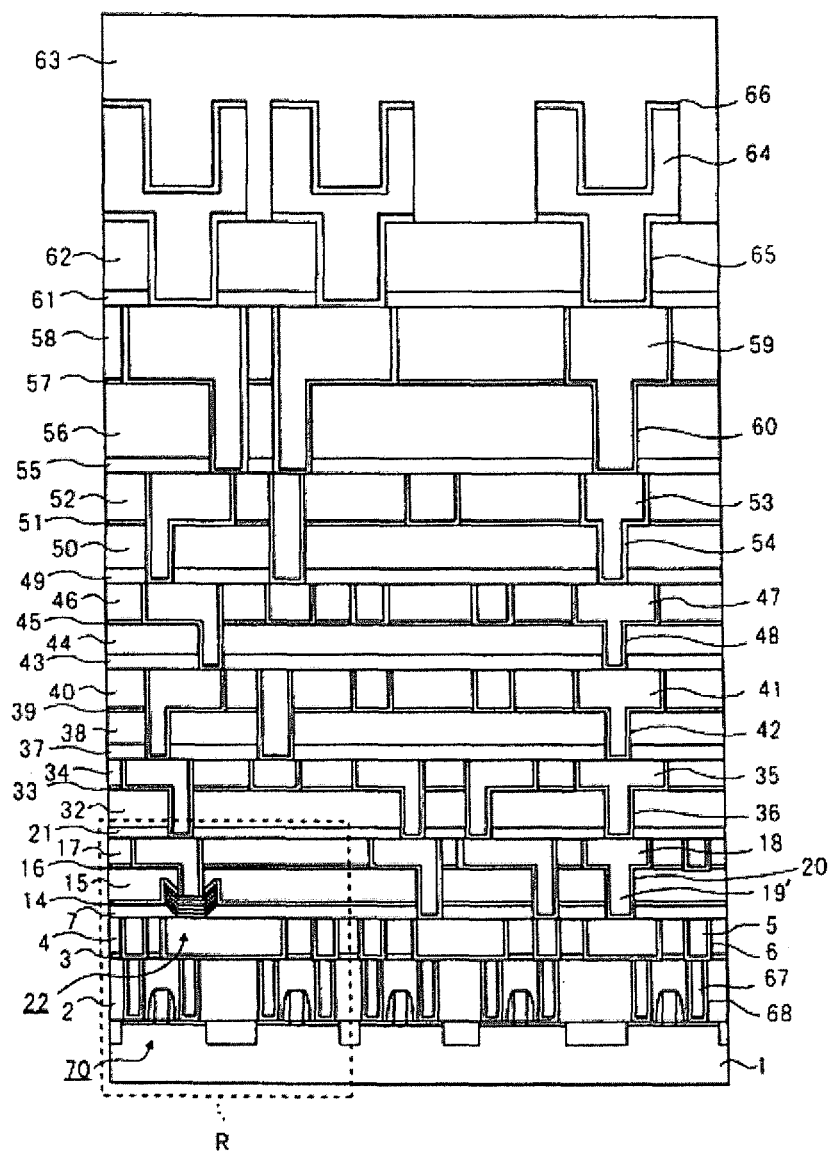
FIG. 12 is a partial schematic cross-section view showing the configuration of the semiconductor device according to Embodiment 7 of the present invention.
Figure 13:
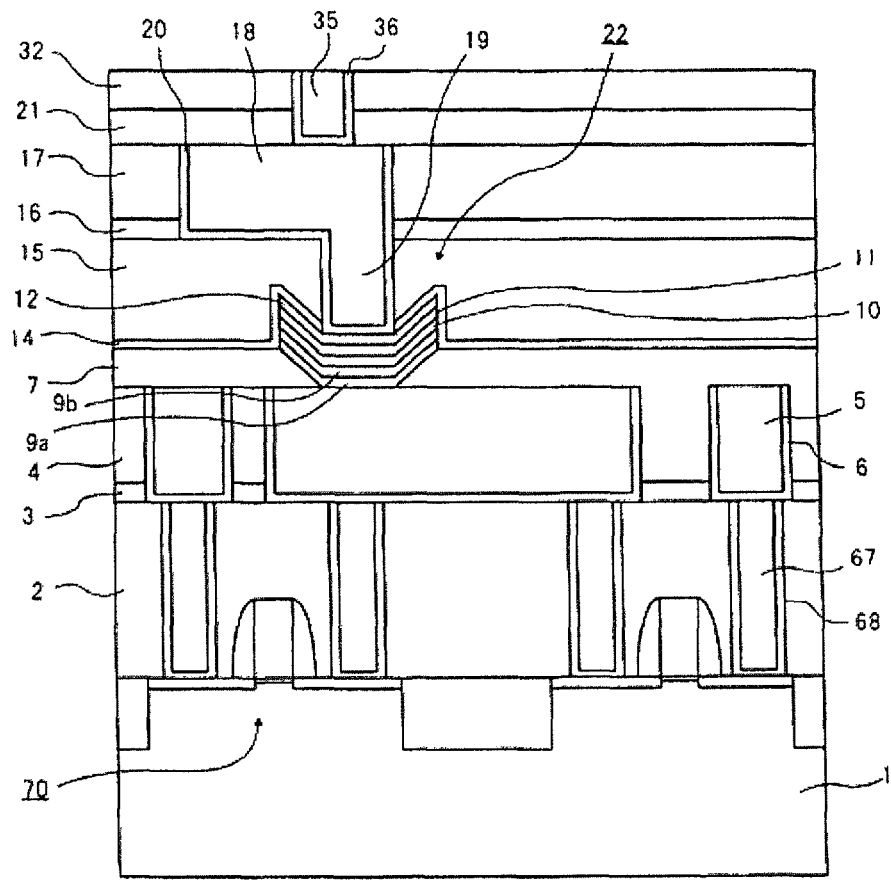
FIG. 13 is an enlarged cross-section view of R section in FIG. 12 showing the configuration of the semiconductor device according to Embodiment 7 of the present invention
Figure 14A:
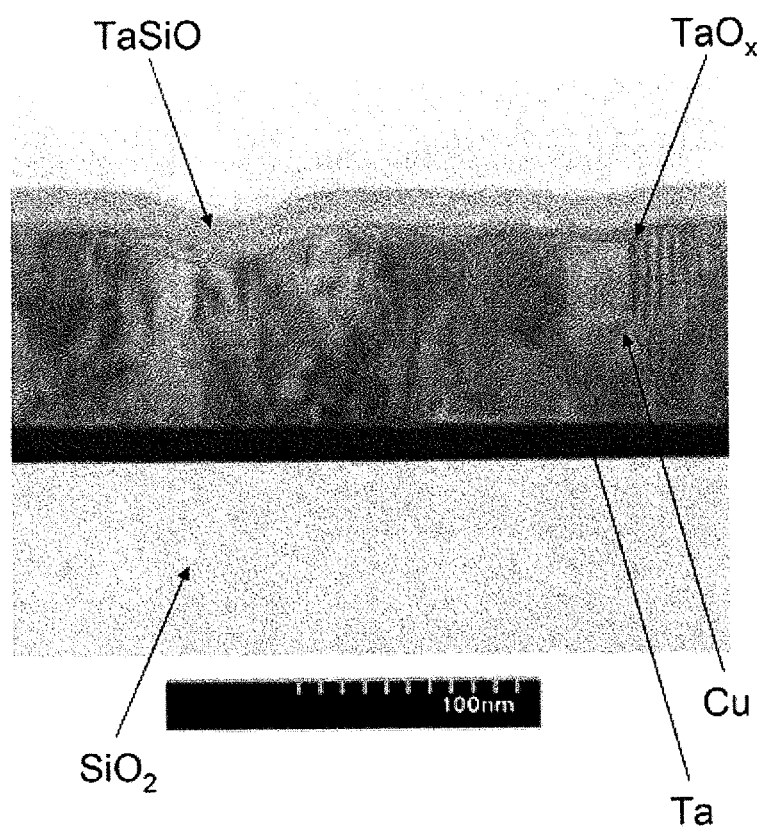
FIG. 14A is a result of TEM cross-section observation in Example (Ta; 1 nm).
Figure 14B:
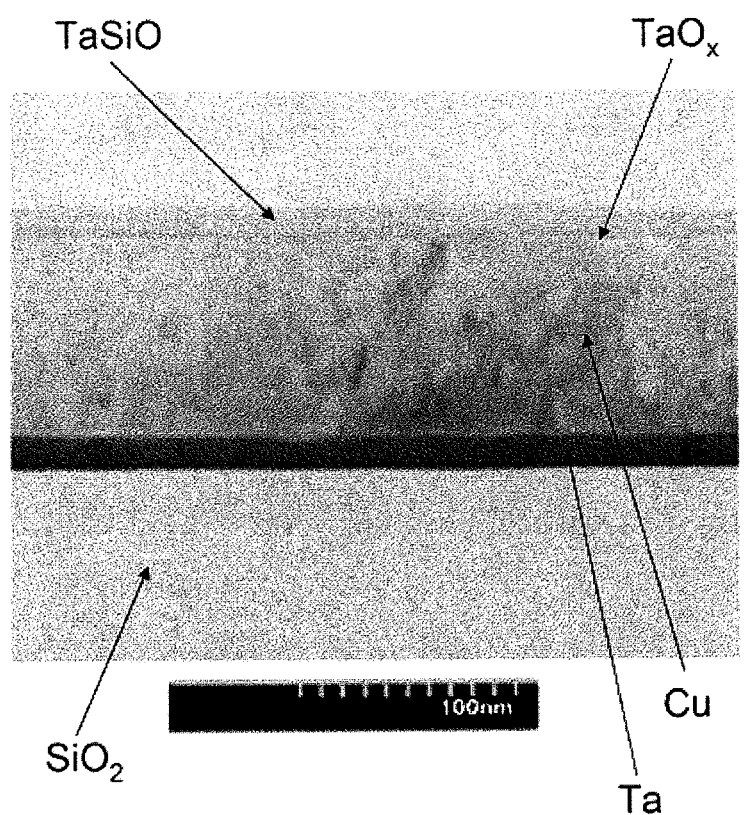
FIG. 14B is a result of TEM cross-section observation in Example (Ta; 2 nm).
Figure 14D:
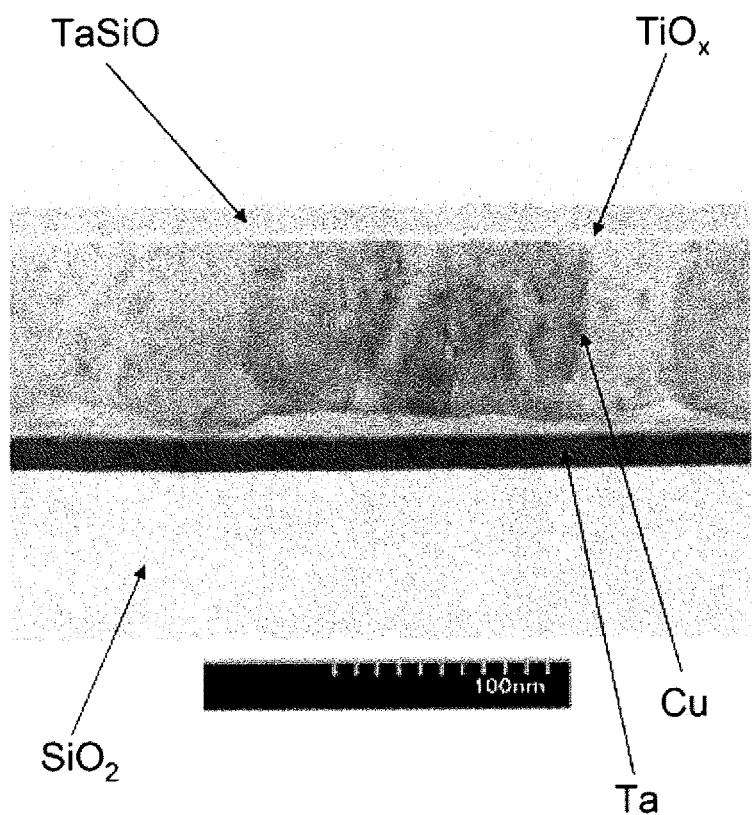
FIG. 14D is a result of TEM cross-section observation in Example (Ti; 2 nm).
Figure 14E:
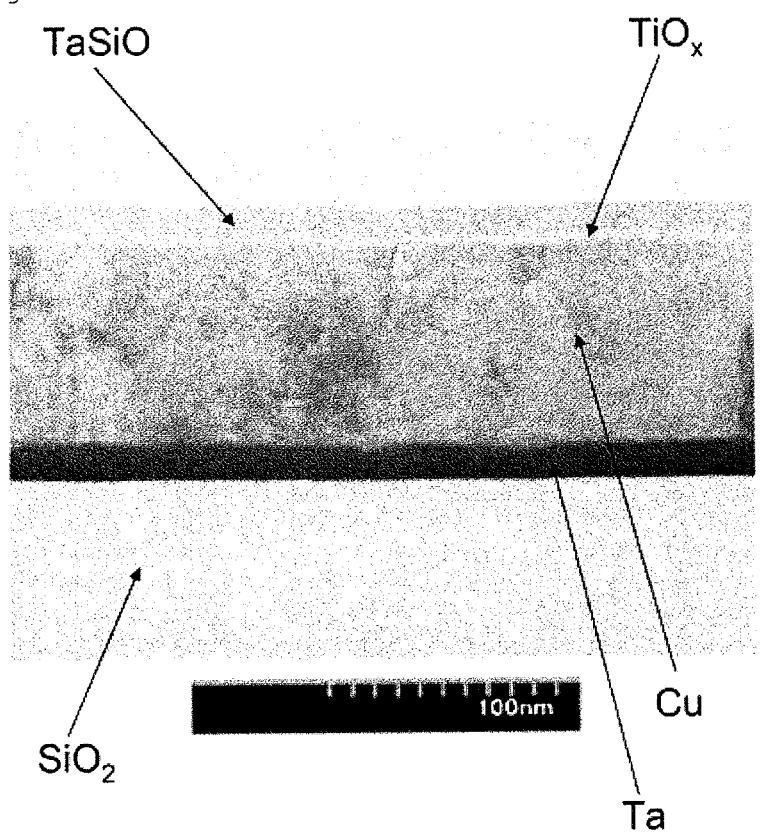
FIG. 14E is a result of TEM cross-section observation in Example (Ti; 3 nm).

FIG. 12 is a partial schematic cross-section view showing the configuration of the semiconductor device according to this Embodiment. FIG. 13 is a partially enlarged cross-section view of R section in FIG. 12 showing the configuration of the semi-conductor device according to this Embodiment.

According to this Embodiment, selective transistor 70 (MOSFET) as a semiconductor substrate 1 is formed on semiconductor substrate 1, the multiple wiring layers (2~8, 14~21, 32~68) is formed on semiconductor substrate 1 containing selective transistor 70, and resistance-variable element 22 which is identical with that of Embodiment 2 is incorporated within the multiple wiring layers (2~7, 14~21, 32~68). Other configurations of resistance-variable element 22 are the same as in Embodiment 2.

The multiple wiring layers (2~7, 14~21, 32~68) has the insulating laminated body in which interlayer insulating film 2, barrier insulating film 3, interlayer insulating film 4, insulating barrier film 7, protective insulating film 14, interlayer insulating film 15, etching stopper film 16, interlayer insulating film 17, barrier insulating film 21, interlayer insulating film 32, etching stopper film 33, interlayer insulating film 34, barrier insulating film 37, interlayer insulating film 38, etching stopper film 39, interlayer insulating film 40, barrier insulating film 43, interlayer insulating film 44, etching stopper film 45, interlayer insulating film 46, barrier insulating film 49, interlayer insulating film 50, etching stopper film 51, interlayer insulating film 52, barrier insulating film 55, interlayer insulating film 56, etching stopper film 57, interlayer insulating film 58, barrier insulating film 61, interlayer insulating film 62 and protective insulating film 63 are laminated on semiconductor substrate 1 in this order.

In the multiple wiring layers, plug 67 is embedded into the pre-formed hole formed in interlayer insulating film 3 with barrier metal 68 interposed. In the multiple wiring layers, first wiring 5 is embedded into the wiring groove formed on interlayer insulating film 4 and barrier insulating film 3 with barrier metal 6 interposed. In the multiple wiring layers, second wiring 18 is embedded into the wiring groove formed on etching stopper film 16 and interlayer insulating film 17, plug 19' is embedded into the pre-formed hole formed in interlayer insulating film 15, protective insulating film 14 and hard mask film 12, second wiring 18 is integrally formed with plug 19', and the side and bottom surfaces of second wiring 19 and plug 19' are covered with barrier metal 20. In the multiple wiring layers, wiring 35 is embedded into the pre-formed hole formed in interlayer insulating film 32 and barrier insulating film 21, and the wiring groove formed on interlayer insulating film 34 and etching stopper film 33 with barrier metal 36 interposed. In the multiple wiring layers, wiring 41 is embedded into the pre-formed hole formed in interlayer insulating film 38 and barrier insulating film 37, and the wiring groove formed on interlayer insulating film 40 and etching stopper film 39 with barrier metal 42 interposed. In the multiple wiring layers, wiring 47 is embedded into the pre-formed hole formed in interlayer insulating film 44 and barrier insulating film 43, and the wiring groove formed on interlayer insulating film 46 and etching stopper film 45 with barrier metal 48 interposed. In the multiple wiring layers, wiring 53 is embedded into the pre-formed hole formed in interlayer insulating film 50 and barrier insulating film 49, and the wiring groove formed on interlayer insulating film 52 and etching stopper film 51 with barrier metal 54 interposed. In the multiple wiring layers, wiring 59 is embedded into the pre-formed hole formed in interlayer insulating film 56 and barrier insulating film 55, and the wiring groove formed on interlayer insulating film 58 and etching stopper film 57 with barrier metal 60 interposed.

In the multiple wiring layers, wiring 64 is embedded into the pre-formed hole formed in interlayer insulating film 62 and barrier insulating film 61 with barrier metal 65 interposed, wiring 64 is formed on interlayer insulating film 62 with barrier metal 65 interposed, barrier metal 66 is formed on wiring 64, and protective insulating film 63 is formed on interlayer insulating film 62 containing barrier metal 66, wiring 64 and barrier metal 65.

The source/drain electrode of selective transistor 70 is connected electrically to the most-top wiring 64 with the corresponding plug 67, first wiring 5, plug 19', second wiring 18, wirings 35, 41, 47, 53 and 59 interposed.

Insulating barrier film 7 has an opening on first wiring 5. The wall surface of opening of insulating barrier film 7 has a taper shape in which its width is widened as it keeps apart from first wiring 5. The tapered surface of opening of insulating barrier film 7 has the angle of 85° or less with respect to the top surface of first wiring 5.

The multiple wiring layers has resistance-variable element 22 in which ion-conductive layers 9a and 9b, first upper electrode 10 and second upper electrode 11 are laminated in this order on first wiring 5 also serving as the lower electrode in the opening formed on insulating barrier film 7. Also, hard mask film 12 is formed on second upper electrode 11, and the top or side surfaces of laminated body of ion-conductive layers 9a and 9b, first upper electrode 10, second upper electrode 11 and hard mask film 12 are covered with protective insulating film 14.

Resistance-variable element 22 has the configuration in which ion-conductive layers 9a and 9b are interposed between first wiring 5 also serving as the lower electrode and upper electrodes 10 and 11 connected electrically to second wiring 18 with plug 19 interposed. First ion-conductive layer 9a is formed on first wiring 5, the tapered surface of opening of insulating barrier film 7, or insulating barrier film 7. Also, first ion-conductive layer 9a is directly contacted with first wiring 5 at the opening formed on insulating barrier film 7. In addition, second upper electrode 11 is connected to plug 19 on second upper electrode 11 with barrier metal 20 interposed. Plug 19 is embedded into the pre-formed hole formed in interlayer insulating film 15, protective insulating film 14 and hard mask film 12 with barrier metal 20 interposed.

As the wirings (including plugs; 5, 18, 19, 19', 35, 41, 47, 53, 59), Cu may be used. As the most-top wiring 64, Al may be used. As plug 67, tungsten may be used. As the barrier metal (6, 20, 36, 42, 48, 54, 60), a Ta/TaN laminated body may be used. As barrier metal 65, 66, a Ti/TiN laminated body may be used. As barrier metal 68, TiN may be used. As the interlayer insulating films (2, 4, 15, 17, 32, 34, 38, 40, 44, 46, 50, 52, 56, 58), a SiOCH film having specific dielectric constant of 3 or less may be used. As interlayer insulating film 62, a silicon oxide film may be used. As protective insulating film 63, a silicon oxy-nitride film may be used. As insulating barrier film 7 on first wiring 5, SiN may be used. As the insulating barrier films (including the barrier insulating film, the etching stopper film; 3, 16, 21, 33, 37, 43, 49, 55, 61) other than insulating barrier film, a SiCN film having low specific dielectric constant may be used.

In resistance-variable element 22, Cu may be used as first wiring 19 also serving as the lower electrode, a titanium oxide film may be used as first ion-conductive layer 9a, and TaSiO may be used as second ion-conductive layer 9b. Also, Ru may be used as first upper electrode 10, TaN may be used as second upper electrode 11, and a SiN film may be used as hard mask film 12 on second upper electrode 11. Also, a SiN film formed by high density plasma CVD may be used as protective insulating film 14 covering resistance-variable element 22 containing hard mask film 12.

As a method for manufacturing the semiconductor device according to this Embodiment, the peripheral portion of resistance-variable element 22 may be used by the same method as in Embodiment 2, but other components may be used by usual methods known in the art.

Further, although the configuration in which single layer of resistance-variable element 22 is formed within the multiple wiring layers in this Embodiment, multiple layers of resistance-variable elements 22, 22' may be formed in the vertical direction within the multiple wiring layers, as shown in FIG. 13. Also, it is possible to have the configuration in which the lower electrode of resistance-variable element 22' is connected electrically to second wiring 17, the upper electrode of resistance-variable element 22' is connected electrically to plug 36, and second wiring 17 also serves as the lower electrode of resistance-variable element 22'. In addition, multiple resistance-variable elements may be formed on separate layers or the same layer. In case of a high technology ULSI (Ultra-Large Scale Integration), transistors are often connected using a copper wiring of 5 layers or more, and in some cases, the number of wiring layers may be 10 layers or more. According to the present invention, the resistance-variable element may be formed using the reduced number of processes at any layer in the top portion of wiring. The laminated structure thus formed is effective as a switching-element or FPGA as described above, as well as a memory element for achieving a large scale memory amount.

According to this Embodiment, in addition to the same effect as in Embodiment 2, the plug (member 19 of FIG. 13) on resistance-variable element 22 and the plug (member 19' of FIG. 12) present in the same layer other than the region of resistance-variable element 22 may be concurrently formed, thereby allowing the simplification of the procedure. Also, by using the configuration according to this Embodiment, the resistance-variable element may be provided within a high technology ULSI device.

The present invention may be applied to any element-forming process in forming the resistance-variable element within the copper multilayer wiring as long as the element should have low resistance and high reliability, and the present invention is not limited to a particular application. Further, the structure of the resistance-variable element may have a structure laminated with other films, and the present invention is not limited to a particular structure. The present invention has the configuration in which the copper wiring is the lower electrode of resistance-variable element, or alternatively copper wiring is integrally formed with the lower electrode.

(Embodiment 8)

As described above, oxides primarily containing Ta may be formed by an atomic layer deposition method (ALD method), in addition to a sputtering method. For example, a method of forming a $Ta_2O_5$ film will be described below.

First, a $Ta_2O_5$ film is grown in a fluoro-type reactor at 325° C. For example, a raw material may be formed by adding an oxidizing agent to tantalum pentachloride ($TaCl_5$) and tantalum pentaethoxide ($Ta(OC_2H_5)_5$). $TaCl_5$ and $Ta(OC_2H_5)_5$ are vaporized by heating to 90° C. and 105° C., respectively, in the reactor. The $Ta_2O_5$ film is grown by pulsing alternately $TaCl_5$ and $Ta(OC_2H_5)_5$. The duration of pulse may be 0.5 s ($TaCl_5$) and 1.0 s ($Ta(OC_2H_5)_5$), for example.

Then, a washing is performed for 0.2 s and 1.0 s, respectively. The deposition temperature is 275~325° C.

For example, the film is grown at the rates of 0.015 nm/cycle (275° C.) and 0.06 nm/cycle (325° C.). The desired film thickness may be obtained by repeating the cycle. As suitable oxidizing agents, oxygen, ozone, nitrogen dioxide, nitrogen oxide, water vapor, hydrogen peroxide, formic acid, acetic acid, anhydrous acetic acid, and the like may be used for promoting reactions.

The present invention has been described with reference to several preferred embodiments or examples. However, these embodiments and examples only intend to illustrate the present invention, but the present invention is not limited to these embodiments and examples.

For example, the technologies of semiconductor manufacturing device comprising a CMOS circuit as an application field constructing the background of the invention achieved by the inventors of the present application were described in detail, and the example where resistance-variable element is formed on the top of copper wiring on the semiconductor substrate was described. However, the present invention is not limited to these examples described herein, and also may be applied to copper wirings used in, for example, semiconductor products comprising a memory circuit such as DRAM (Dynamic Random Access Memory), SRAM (Static Random Access Memory), flash memory, FRAM (Ferro Electric Random Access Memory), MRAM (Magnetic Random Access Memory), variable resistance memory, bipolar transistor, and the like; semiconductor products comprising a logic circuit such as microprocessor; or boards or packages provided with both of memory and logic circuits. Further, the present invention may be used for bonding elements such as electronic circuit elements, optical circuit elements, quantum circuit elements, micromachines, or MEMS (Micro Electro Mechanical Systems) to a semiconductor device. Although embodiments realizing a switching function were often described herein, the present invention may be used for a memory element utilizing both of non-volatility and resistance-variable property.

Also, the boding method of substrate using the present invention may be confirmed from the finished product. Specifically, a multilayer wiring using a copper wiring may be confirmed by observing the cross-section of a device by TEM (Transmission Electron Microscope). When a resistance-variable element is provided, it may be confirmed by observing the presence of an ion-conductive layer in which the bottom surface of the resistance-variable element is a copper wiring, and the copper wiring also serves as a lower electrode. Further, in addition to TEM, materials used may be confirmed by composition analysis by a method such as EDX (Energy Dispersive X-ray Spectroscopy) or EELS (Electron Energy-Loss Spectroscopy). In addition, by such composition analysis, it may be confirmed whether an insulating barrier film on the copper wiring is the same material as a protective film of the resistance-variable element or not.

The present application claims the priority based on Japanese Patent Application No. 2009-150777 filed on Jun. 25, 2009, and all of the disclosure of which is hereby incorporated.

The present invention has been described with reference to the exemplary embodiments, but the present invention is not limited thereto. A variety of changes that can be understood by those skilled in the art can be made to the configurations and details of the present invention within the scope thereof.

THE DESCRIPTION OF NUMERICAL REFERENCES 1 semiconductor substrate
2 interlayer insulating film
3 barrier insulating film
4 interlayer insulating film
5, 5a, 5b first wiring (wiring, lower electrode)
5c TaN/Ru laminated lower electrode (second lower electrode)
6, 6a, 6b barrier metal
7 insulating barrier film
8 hard mask film (hard mask)
9a first ion-conductive layer
9b second ion-conductive layer
10 first upper electrode
11 second upper electrode
12 hard mask film
13, 23, 28 hard mask film (제 2 hard mask film)
14, 14', 24, 29 protective insulating film
15 interlayer insulating film
16 etching stopper film
17 interlayer insulating film
18, 18a, 18b second wiring
19, 19a, 19b plug
20, 20a, 20b barrier metal
21 barrier insulating film
22, 22', 25, 26, 30, 31 resistance-variable element
32, 34 interlayer insulating film
33 etching stopper film
35 copper wiring
36 barrier metal
37 barrier insulating film
38, 40 interlayer insulating film
39 etching stopper film
41 copper wiring
42 barrier metal
43 barrier insulating film
44, 46 interlayer insulating film
45 etching stopper film
47 copper wiring
48 barrier metal
49 barrier insulating film
50, 52 interlayer insulating film
51 etching stopper film
53 copper wiring
54 barrier metal
55 barrier insulating film
56, 58 interlayer insulating film
57 etching stopper film
59 copper wiring
60 barrier metal
61 barrier insulating film
62 silicon oxide film
63 silicon oxy-nitride film
64 AlCu wiring
65, 66 Ti/TiN film
67 tungsten plug
68 TiN film
70 selective transistor
71a, 71b via hole
72a, 72b groove

What is claimed is:
1. A semiconductor device comprising:
a resistance-variable element provided within multiple wiring layers on a semiconductor substrate, the resistance-variable element comprising a first electrode which is entirely embedded in a wiring groove and also serves as a wiring of the multiple wiring layers, a first ion-conductive layer composed of an oxide film of valve-metal on the first electrode, a second ion-conductive layer containing oxygen on the first ion-conductive layer and a second electrode on the second ion-conductive layer; and
an insulating barrier film formed on the first electrode, the insulating barrier film having an opening with a tapered surface that extends along and recedes from the first electrode,
wherein the first ion-conductive layer is in direct physical contact with the first electrode at the opening and the first ion-conductive layer is also formed on the tapered surface,
wherein the outer peripheries of the first ion-conductive layer, the second ion-conductive layer and the second electrode are arranged at a same position in the plane parallel to the semiconductor substrate,
wherein the first electrode comprises copper, and wherein the oxide film of valve-metal is a titanium oxide film.

2. The semiconductor device according to claim 1, wherein the oxide film of valve-metal is a titanium oxide film, and the thickness of the titanium oxide film is 4 nm or less.

3. The semiconductor device according to claim 1, wherein the second ion-conductive layer is an oxide primarily containing at least one of Ta, Zr and Hf.

4. The semiconductor device according to claim 3, wherein the second ion-conductive layer is a composite oxide of Ta and Si.

5. The semiconductor device according to claim 4, wherein the oxide film of valve-metal is a titanium oxide film, and the thickness of the titanium oxide film is 4 nm or less, and
the total thickness of a laminated structure comprising the titanium oxide and the composite oxide of Ta and Si is 20 nm or less.

6. The semiconductor device according to claim 3, wherein the second ion-conductive layer is a composite oxide of Zr and Si.

7. The semiconductor device according to claim 3, wherein the second ion-conductive layer is a composite oxide of Hf and Si.

8. The semiconductor device according to claim 1, wherein
the multiple wiring layers further has a plug connected electrically to the second electrode,
the second electrode comprises a first upper electrode in contact with the second ion-conductive layer and a second upper electrode in contact with the plug, and the first upper electrode comprises Ru or Ni.

9. The semiconductor device according to claim 8, wherein the second upper electrode comprises Ti. Ta, W, or nitrides thereof.

10. A method for manufacturing the semiconductor device according to claim 1, comprising the step of:
forming a valve-metal film on the first electrode, and
oxidizing the valve-metal film while forming the second ion-conductive layer under the presence of oxygen.

11. The method for manufacturing the semiconductor device according to claim 10, wherein the ion-conductive layer is formed by a sputtering or ALD method.

12. The method for manufacturing the semiconductor device according to claim 11, wherein the valve-metal film is a titanium film, and the thickness of the titanium film is 2 nm or less.

13. The method for manufacturing the semiconductor device according to claim 10, wherein the second ion-conductive layer is formed using TaSiO as a target under the presence of oxygen by a high frequency sputtering method.

14. The method for manufacturing the semiconductor device according to claim 13, wherein the high frequency sputtering method is performed using a mixed gas of oxygen and argon.

15. The semiconductor device according to claim 1, wherein
the multiple wiring layers further has a plug connected electrically to the second electrode, and the plug is arranged above the opening formed in the insulating barrier film, and a diameter of a bottom of the plug is less than a diameter of the opening.

16. The semiconductor device according to claim 1, wherein a barrier metal layer is disposed between an inner wall of the wiring groove and the first electrode.

* * * * *

UNITED STATES PATENT AND TRADEMARK OFFICE
CERTIFICATE OF CORRECTION

| | | |
|---|---|---|
| PATENT NO. | : 9,059,028 B2 | Page 1 of 1 |
| APPLICATION NO. | : 13/380728 | |
| DATED | : June 16, 2015 | |
| INVENTOR(S) | : Munehiro Tada et al. | |

It is certified that error appears in the above-identified patent and that said Letters Patent is hereby corrected as shown below:

IN THE CLAIMS

Column 29, Line 14: In Claim 5, delete "total" and insert -- total film --.

Signed and Sealed this
Twenty-second Day of December, 2015

Michelle K. Lee
*Director of the United States Patent and Trademark Office*